(12) United States Patent
Chambers et al.

(10) Patent No.: US 7,605,665 B2
(45) Date of Patent: Oct. 20, 2009

(54) FRACTIONAL-N PHASE LOCKED LOOP

(75) Inventors: Mark Chambers, Laguna Hills, CA (US); Natarajan Ramachandran, Huntingdon Beach, CA (US); Karapet Khanoyan, Lake Forest, CA (US); Tong Zhu, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 7 days.

(21) Appl. No.: 11/802,879

(22) Filed: May 25, 2007

(65) Prior Publication Data

US 2008/0290954 A1   Nov. 27, 2008

(51) Int. Cl.
*H03L 7/18* (2006.01)
*H03L 7/197* (2006.01)

(52) U.S. Cl. .............................. 331/16; 331/1 A; 331/25
(58) Field of Classification Search .............. 331/16–18, 331/25, 1 A; 327/115, 117–118, 156–159
See application file for complete search history.

(56) References Cited

U.S. PATENT DOCUMENTS

| | | | | |
|---|---|---|---|---|
| 5,970,110 | A * | 10/1999 | Li .............................. | 377/48 |
| 6,714,056 | B2 * | 3/2004 | Fallahi et al. ................ | 327/115 |
| 7,042,258 | B2 * | 5/2006 | Booth et al. ................. | 327/115 |
| 7,356,111 | B1 * | 4/2008 | Dean ........................... | 375/376 |
| 2003/0198311 | A1 * | 10/2003 | Song et al. ................... | 375/376 |
| 2003/0231069 | A1 * | 12/2003 | Chiang et al. ................ | 331/45 |
| 2005/0197073 | A1 * | 9/2005 | Klemmer ..................... | 455/76 |
| 2006/0245531 | A1 * | 11/2006 | Leonowich et al. .......... | 375/376 |
| 2007/0285176 | A1 * | 12/2007 | North ........................... | 331/8 |

OTHER PUBLICATIONS

Meninger, S., *Sigma-Delta Fractional-N Frequency Synthesis*, Massachusetts Institute of Technology, Jun. 7, 2004, downloaded from http://www-mtl.mit.edu/~coyote/rfic6.pdf.

* cited by examiner

*Primary Examiner*—David Mis
(74) *Attorney, Agent, or Firm*—Sterne, Kessler, Goldstein & Fox, P.L.L.C.

(57) ABSTRACT

An apparatus and method is disclosed to substantially reduce phase noise introduced in fractional-N phase-locked loop (PLL) through feedback modulation. A fractional frequency divider is introduced in the feedback path of the PLL to generate a true fractional division factor with finite fractional steps to increase the resolution of the PLL by a factor equal to the inverse of the finite step size in the fractional frequency divider. Increasing the resolution of the PLL reduces phase noise. The fractional frequency divider uses the true fractional division factor to divide the frequency of a single output of a multi-phased voltage controlled oscillator (VCO) by the fractional division factor to match the frequency of the divided feedback signal to frequency a reference signal. The fractional frequency divider incrementally selects among all the outputs of the multi-phased VCO according to either a forward phase shifting operation or a backward phase shifting operation to generate a true fractional division factor.

48 Claims, 18 Drawing Sheets

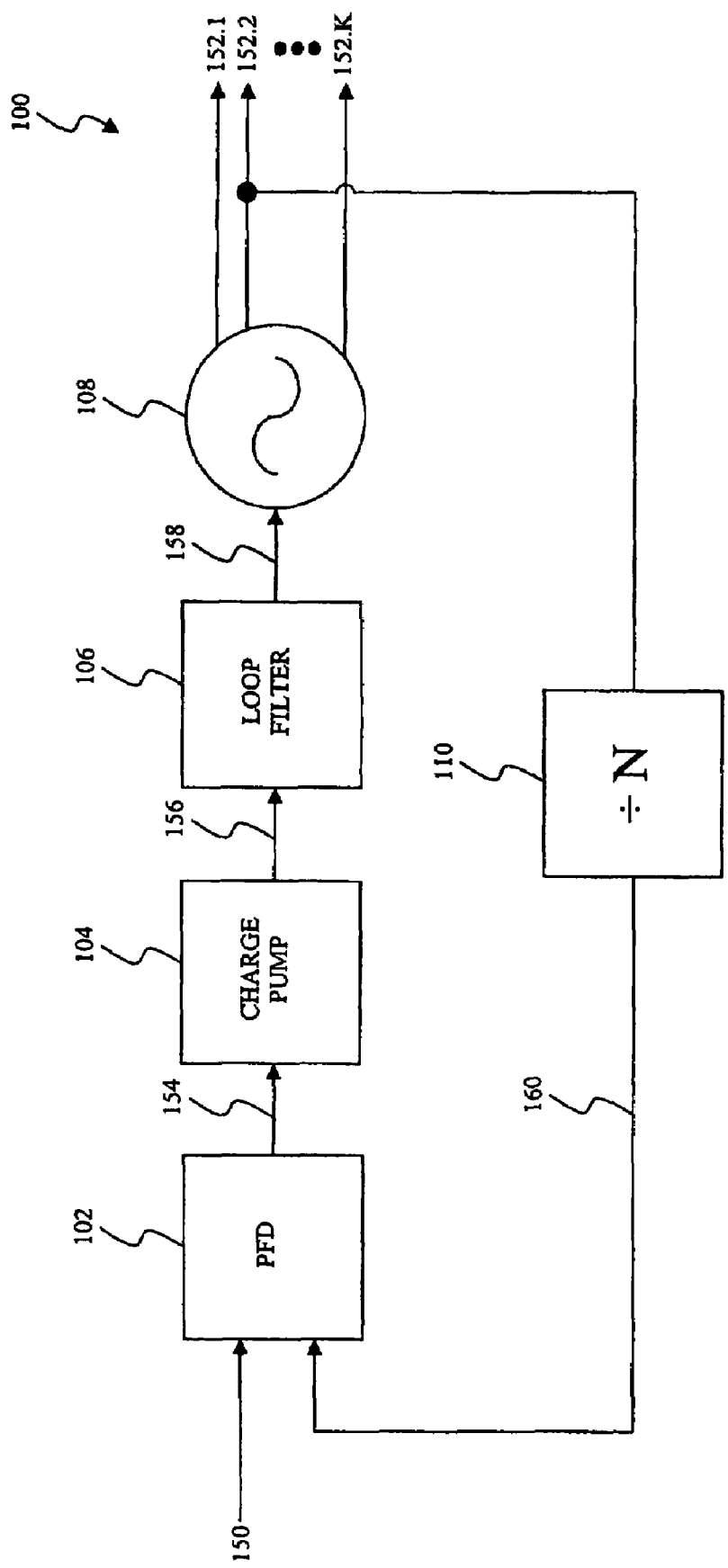
FIG. 1 (CONVENTIONAL)

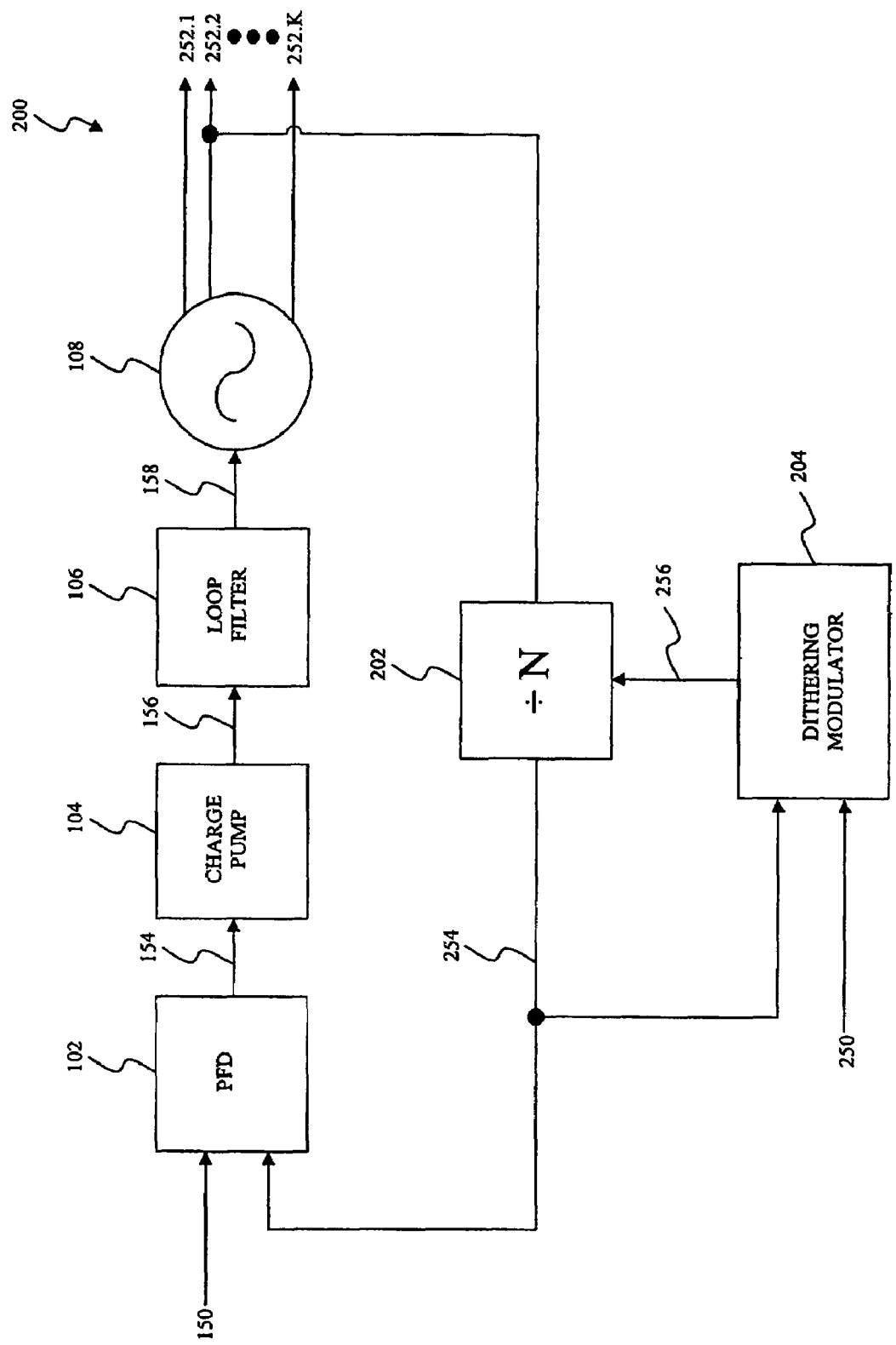
FIG. 2 (CONVENTIONAL)

FRACTIONAL-N PHASE LOCKED LOOP

BACKGROUND OF THE INVENTION

1. Field of the Invention

The present invention relates generally to phase-locked loops (PLL) and specifically to a fractional-N phase-locked loop.

2. Related Art

Radio, telecommunications, computers, and other electronic applications for signal stabilization, signal detection, frequency demodulation, or bit synchronization to provide some examples widely use phase-locked loops (PLL). These applications may include frequency synthesizers for digitally-tuned radio receivers and transmitters, the demodulation of frequency modulated (FM) and amplitude modulated (AM) signals, the recovery of small signals that otherwise would be lost in noise, the recovery of clock timing information from a data stream, clock multipliers in microprocessors, or dual-tone multi-frequency (DTMF) decoders, modems, and other tone decoders for remote control and telecommunications to provide some examples.

The PLL is a closed-loop feedback control system that generates a signal in relation to the frequency and phase of a reference signal. In their most basic form, PLL mechanisms may be implemented as either analog or digital circuits using a phase/frequency detector (PFD), a charge pump, a voltage controlled oscillator (VCO), and a feedback path. The PFD produces an error signal by comparing a frequency and a phase of the VCO to a frequency and a phase of the reference signal. The charge pump generates a reference or tuning voltage to be applied to the VCO based on the error signal. The PLL responds to the tuning voltage by automatically raising or lowering an output frequency of the VCO until the frequency and a phase of the output frequency of the VCO is matched with the frequency and the phase of the reference signal. An optional loop filter may remove undesirable noise from the tuning voltage.

The PLL may also include frequency divider in a feedback configuration between the VCO and the PFD. The frequency divider may divide the output frequency of the VCO by a corresponding value depending on the frequency of the reference signal. The PLL may be implemented as a integer PLL, including an integer divider, to divide the VCO output frequency by an integer multiple of the frequency of the reference signal. However, in some applications it may be desirable to cause the VCO to output a frequency that is a fractional multiple of the reference signal. In this situation, a fractional-N PLL is necessary to divide the output frequency of the VCO by a fractional multiple.

Various techniques are used to implement a fractional-N PLL frequency divider. Conventional methods, such as using a programmable pulse swallowing counter or various techniques of modulation of the feedback divider's integer value, to yield an effective non-integer value, may generate additional phase noise and time domain jitter at the output of the PLL. Therefore, what is needed is a PLL having a fractional frequency divider to reduce the phase noise and the time domain jitter at the output of the fractional-N PLL.

BRIEF DESCRIPTION OF THE DRAWINGS/FIGURES

The accompanying drawings illustrate the present invention and, together with the description, further serve to explain the principles of the invention and to enable one skilled in the pertinent art to make and use the invention.

FIG. 1 is a block diagram of a conventional integer-N phase-locked loop.

FIG. 2 is a block diagram of a conventional fractional-N phase-locked loop.

Figure 3:
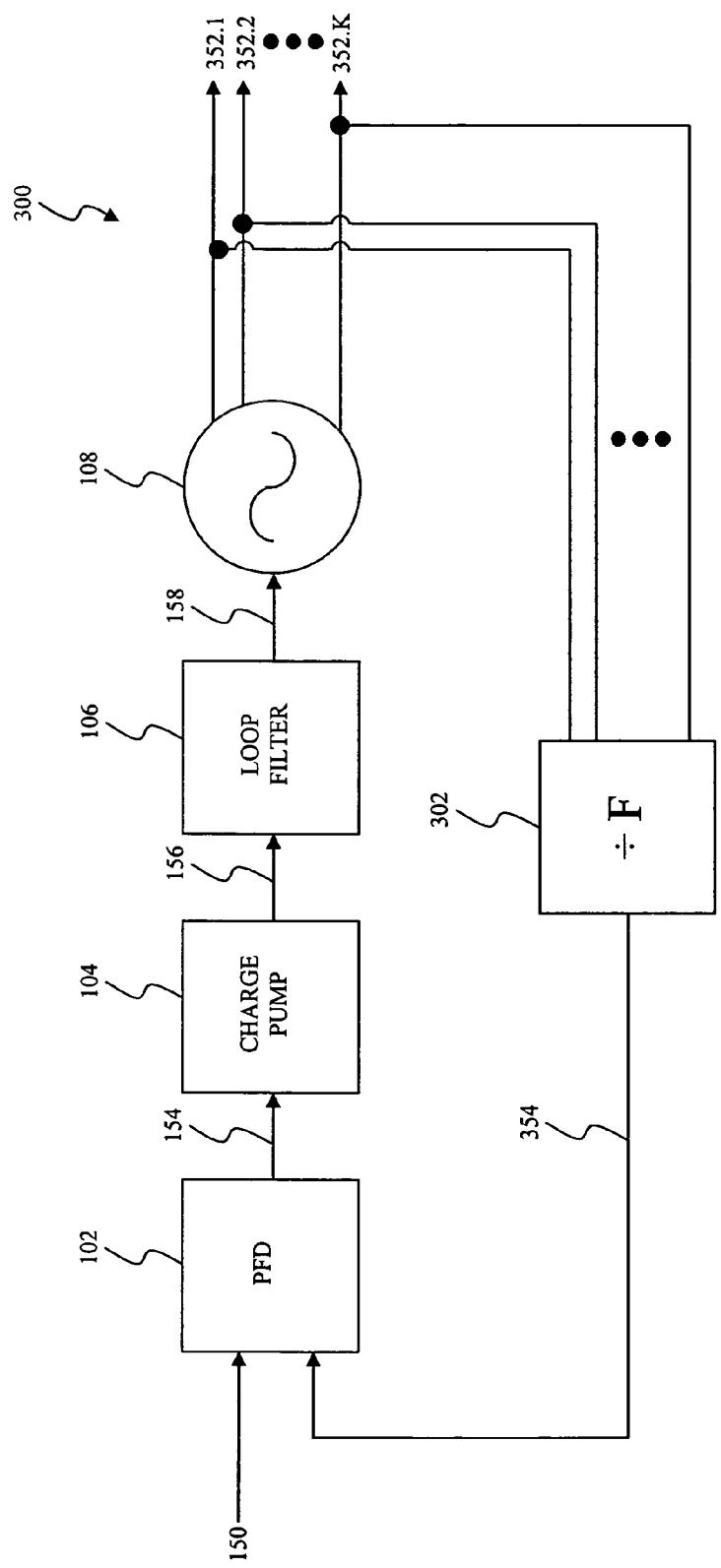
FIG. 3 is a block diagram of a fractional-N phase-locked loop according to an exemplary embodiment of the present invention.

The present invention will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE INVENTION

The following detailed description of the present invention refers to the accompanying drawings that illustrate exemplary embodiments consistent with this invention. Other embodiments are possible, and modifications may be made to the embodiments within the spirit and scope of the invention. Therefore, the detailed description is not meant to limit the invention. Rather, the scope of the invention is defined by the appended claims.

FIG. 1 is a block diagram of a conventional integer-N phase-locked (PLL) loop. The PLL 100 is a closed-loop feedback control system that generates a voltage controlled oscillator (VCO) output 152 in relation to a frequency and a phase of a reference signal 150. In other words, the PLL 100 performs frequency multiplication, via a negative feedback mechanism, to generate the VCO output 152 in terms of the reference signal 150. The PLL 100 may be implemented using a phase/frequency detector (PFD) 102, a charge pump 104, an optional loop filter 106, a VCO 108, and an integer frequency divider 110.

The PFD 102 is a device that converts the difference between the phase of the reference signal 150 and a phase of a divided feedback signal 160 into an error signal. The PFD 102 may be implemented using a discrete logic gate such as an exclusive OR (XOR) gate, a comparator, a simple state machine, a flip-flop, a four quadrant multiplier or mixer or any other suitable means. As shown in FIG. 1, the PFD 102 compares the reference signal 150 to the divided feedback signal 160 to generate an error signal 154. More specifically, the PFD 102 produces the error signal 154 by comparing a frequency and the phase of the divided feedback signal 160 to the frequency and the phase of the reference signal 150 to detect for deviations between the phase and/or frequency of the reference signal 150 and the phase and/or frequency of the divided feedback signal 160. When the phase and the frequency of the reference signal 150 and the phase of the divided feedback signal 160 are substantially equivalent, the PLL 100 is in a locked condition. In the locked condition, the error signal 154 is proportional to the phase difference between the reference signal 150 and the divided feedback signal 160.

The charge pump 104 converts the error signal 154 to a voltage domain representation, denoted as charge pump output 156, to control the frequency of the VCO 108. When the PLL 100 is not in the locked condition, the charge pump 104 increases or decreases the charge pump output 156 based on the error signal 154. When the PLL 100 is in the locked condition, the error signal 154 is minimized and the charge pump 104 maintains the charge pump output 156 at a substantially fixed value.

Referring back to FIG. 1, the optional loop filter 106 may be used to remove undesirable noise from the charge pump output 156 to generate a tuning signal 158. The loop filter 106 may be implemented as a low pass filter to suppress high frequency components in the charge pump output 156 to allow a dc component of the charge pump output 160 to control the VCO 108. The loop filter 106 may be implemented using passive components, active components, or a combination of passive and active components.

The VCO 108 is a voltage to frequency converter. As shown in FIG. 1, the VCO 108 produces VCO outputs 152.1 through 152.K based upon the tuning signal 158. More specifically, the VCO 108 generates the VCO outputs 152.1 through 152.K to correct for deviations between the frequency and/or phase of the reference signal 150 and the divided feedback signal 160 based upon the tuning signal 158. In other words, the VCO 108 responds to the tuning signal 158 by automatically raising or lowering the frequency of the VCO outputs 152.1 through 152.K until the frequency of a corresponding VCO output 152 is matched to the reference signal 150 in both frequency and phase. In general, the VCO 108 is a positive feedback amplifier that has a tuned resonator in the feedback loop and may be implemented using an inductive or "LC" oscillator, a crystal oscillator, a ring oscillator, or any other suitable means.

The integer frequency divider 110 is located in the feedback path of the PLL 100. The implementation of the integer frequency divider 110 is well known in the art. As shown in FIG. 1, the integer frequency divider 110 is connected to a single VCO output 152, i.e., VCO output 152.2. This is merely for demonstrative purposes, those skilled in the art will recognize that the integer frequency divider 110 may be connected to any of VCO outputs 152.1 through 152.K without departing from the spirit and scope of the invention. In other words, the input of the integer frequency divider 110 may connect to any one of the VCO outputs 152.1 through 152.K without departing from the spirit and scope of the invention The integer frequency divider 110 generates the divided feedback signal 160 by dividing the corresponding VCO output 152 by an integer multiple, denoted as N in FIG. 1. The integer frequency divider 110 divides the frequency of the corresponding VCO output 152 by the integer multiple N to match the frequency of the divided feedback signal 160 to frequency of the reference signal 150. For example, setting the integer multiple N to four for a reference signal 150 of 25 MHz requires a VCO output 152.2 of 100 MHz to match the divider output 160 and the reference input 150 in frequency.

The frequency of the VCO 108, as shown in FIG. 1, cannot be varied in steps smaller than that of the reference signal 150.

In other words, the PLL 100 can only generate frequencies, such as VCO outputs 152.1 through 152.K, that are an integer multiple of the reference signal 150. It is often desirable to have a PLL with frequency resolution in steps smaller then the reference signal 150. A frequency divider in a fractional-N PLL is not restricted to an integer multiple thereby allowing the frequency of the VCO to be varied in steps smaller than that of the reference signal 150. In other words, a fractional-N PLL allows frequency resolution that is a fractional portion of the reference signal 150.

FIG. 2 is a block diagram of a conventional fractional-N phase-locked loop (PLL). The PLL 200 is a closed-loop feedback control system that generates a voltage controlled oscillator (VCO) output 252 in relation to the frequency and the phase of the reference signal 150. In other words, the PLL 200 performs frequency multiplication, via a negative feedback mechanism, to generate the VCO output 252 in terms of the reference signal 150. The PLL 200 may be implemented using the phase/frequency detector (PFD) 102, the charge pump 104, the optional loop filter 106, the voltage controlled oscillator (VCO) 108, an integer frequency divider 202, and a dithering modulator 204.

As shown in FIG. 2, the PFD 102 converts the difference between the phase of the reference signal 150 and a phase of a divided feedback signal 254 into an error signal. More specifically, the PFD 102 produces the error signal 154 by comparing a frequency and the phase of the divided feedback signal 254 to the frequency and the phase of the reference signal 150 to detect for deviations between the phase and/or frequency of the reference signal 150 and the phase and/or frequency of the divided feedback signal 254. When the phase and the frequency of the reference signal 150 and the phase of the divided feedback signal 254 are substantially equivalent, the PLL 200 is in a locked condition. In the locked condition, the error signal 154 is proportional to the phase difference between the reference signal 150 and the divided feedback signal 254 minimizing the error signal 154.

The VCO 108 produces VCO outputs 252.1 through 252.K based upon the tuning signal 158. More specifically, the VCO 108 generates the VCO outputs 252.1 through 252.K to correct for deviations between the frequency and/or phase of the reference signal 150 and the divided feedback signal 254 based upon the tuning signal 158. In other words, the VCO 108 responds to the tuning signal 158 by automatically raising or lowering the frequency of the VCO outputs 252.1 through 252.K until the frequency of a corresponding VCO output 252 is matched to the reference signal 150 in both frequency and phase.

The integer frequency divider 202 is located in the feedback path of the PLL 200. The implementation of the integer frequency divider 202 is well known in the art. As shown in FIG. 2, the integer frequency divider 202 is connected to a single VCO output 252, i.e., VCO output 252.2. This is merely for demonstrative purposes, those skilled in the art will recognize that the integer frequency divider 202 may be connected to any of VCO outputs 252.1 through 252.K without departing from the spirit and scope of the invention. In other words, the input of the integer frequency divider 202 may connect to any one of the VCO outputs 252.1 through 252.K without departing from the spirit and scope of the invention.

The dithering modulator 204 allows the PLL 200 to dither the divide value over time between two or more integer values to obtain an effective time averaged fractional division factor. More specifically, the dithering modulator 204 randomly selects between the two or more integer divide value, N through N+k, for each iteration of the PLL 200, based upon the division code 256 and the divided feedback signal 254, so that on average, a fractional division factor can be represented. For example, to achieve a fractional division factor of $$N + \frac{1}{2},$$

the integer frequency divider 202 divides the corresponding VCO output 252 by N for one iteration of the PLL 200 then divides the corresponding VCO output 252 by N+1 for a another iteration of the PLL 200, so that on average the corresponding VCO output 252 is divided by $$N + \frac{1}{2}.$$

Similarly, to achieve a fractional division factor of $$N + \frac{1}{3},$$

the integer frequency divider 202 divides the corresponding VCO output 252 by N for two cycles of divider output and then divides the corresponding VCO output 252 by N+1 for a single cycle of divider output, so that on average the corresponding VCO output 252 is divided by $$N + \frac{1}{3}.$$

Those skilled in the art will recognize other fractional division factors may be obtained by selecting among any two or more integer divide values for each iteration of the PLL 200 without departing from the spirit and scope of the invention. The dithering modulator 204 may be implemented using an accumulator, a sigma-delta modulator, or any other suitable means to perform the dithering operation. The dithering modulator 204 generates a division code 256 based upon a fractional control signal 250 and divider output signal 254.

Noise generated by the VCO 108 and the dithering modulator 204 may be significant contributors towards the phase noise and time domain jitter at the output of the PLL 200. The dithering modulator 204 introduces an out of band noise, in the form of phase quantization noise to provide an example, into the PLL 200 through the integer frequency divider 202. On the other hand, the VCO 108 introduces an in-band noise, in the form of VCO noise to provide an example, into the PLL 200. The response of the PLL 200 determines the amount of phase quantization noise and VCO noise present within the PLL 200. For example, decreasing the loop bandwidth of the PLL 200 by optimizing the loop filter 104 may reduce the amount of phase quantization noise, but increase the amount of VCO noise present within the PLL 200. On the other hand, increasing the loop bandwidth of the PLL 200 by optimizing the loop filter 104 may reduce the amount of VCO noise, but increase the amount of amount of phase quantization noise present within the PLL 200.

FIG. 3 is a block diagram of a fractional-N phase-locked loop (PLL) according to an exemplary embodiment of the present invention. The PLL 300 is a closed-loop feedback control system that generates a voltage controlled oscillator (VCO) output 352 in relation to the frequency and the phase of the reference signal 150. In other words, the PLL 300 performs frequency multiplication, via a negative feedback mechanism, to generate the VCO output 352 in terms of the reference signal 150. The PLL 300 may be implemented using the phase/frequency detector (PFD) 102, the charge pump 104, the optional loop filter 106, the voltage controlled oscillator (VCO) 108, and a fractional frequency divider 302.

As shown in FIG. 3, the PFD 102 converts the difference between the phase of the reference signal 150 and a phase of a divided feedback signal 354 into an error signal 154. More specifically, the PFD 102 produces the error signal 154 by comparing a frequency and the phase of the divided feedback signal 354 to the frequency and the phase of the reference signal 150 to detect for deviations between the phase and/or frequency of the reference signal 150 and the phase and/or frequency of the divided feedback signal 354. When the phase and the frequency of the reference signal 150 and the phase of the divided feedback signal 354 are substantially equivalent, the PLL 300 is in a locked condition. In the locked condition, the error signal 154 is proportional to the phase difference between the reference signal 150 and the divided feedback signal 354.

The VCO 108 produces VCO outputs 352.1 through 352.K based upon the tuning signal 158. More specifically, the VCO 108 generates the VCO outputs 352.1 through 352.K to correct for deviations between the frequency and/or phase of the reference signal 150 and the divided feedback signal 354 based upon the tuning signal 158. In other words, the VCO 108 responds to the tuning signal 158 by automatically raising or lowering the frequency of the VCO outputs 352.1 through 352.K until the frequency of a corresponding VCO output 352 is matched to the reference signal 150 in both frequency and phase.

As shown in FIG. 3, the fractional frequency divider 302 uses all the VCO outputs 352.1 through 352.K to generate the divided feedback signal 354. In other words, the fractional frequency divider 302 may use each of VCO outputs 352.1 through 352.K separately or in conjunction with one another to obtain a true fractional division factor, denoted as F in FIG. 3. In other words, instead of randomly selecting between the two or more integer divide values to obtain the effective time averaged fractional division factor as with the conventional PLL 200, the PLL 300 obtains the true fractional division factor. For example, to achieve a fractional division factor of $$N + \frac{1}{2},$$

the PLL 200 divides the corresponding VCO output 352 by N for one iteration of the PLL 200 then divides the corresponding VCO output 352 by N+1 for a another iteration of the PLL 200, so that on average the corresponding voltage controlled VCO output 352 is divided by $$N + \frac{1}{2}.$$

In contrast, to achieve a fractional division factor of $$N + \frac{1}{2},$$

the PLL 300 divides the corresponding VCO output 352 by $$N + \frac{1}{2}$$

for each iteration of the PLL 300. In general the PLL 300 may generate other true fractional division factors of $$N \pm \frac{j}{K},$$

where j may be any integer value between 0 to K−1, by using each of VCO outputs 352.1 through 352.K separately or in conjunction with one another. For example, by using a VCO 108 having VCO outputs 352.1 through 352.4, the PLL 300 may generate true fractional division factors of 9.25, 9.5, 9.75, and 10 or 10, 10.25, 10.5 and 10.75 depending on whether the fractional portion j/K is added or subtracted from the integer value of 10.

Figure 4:
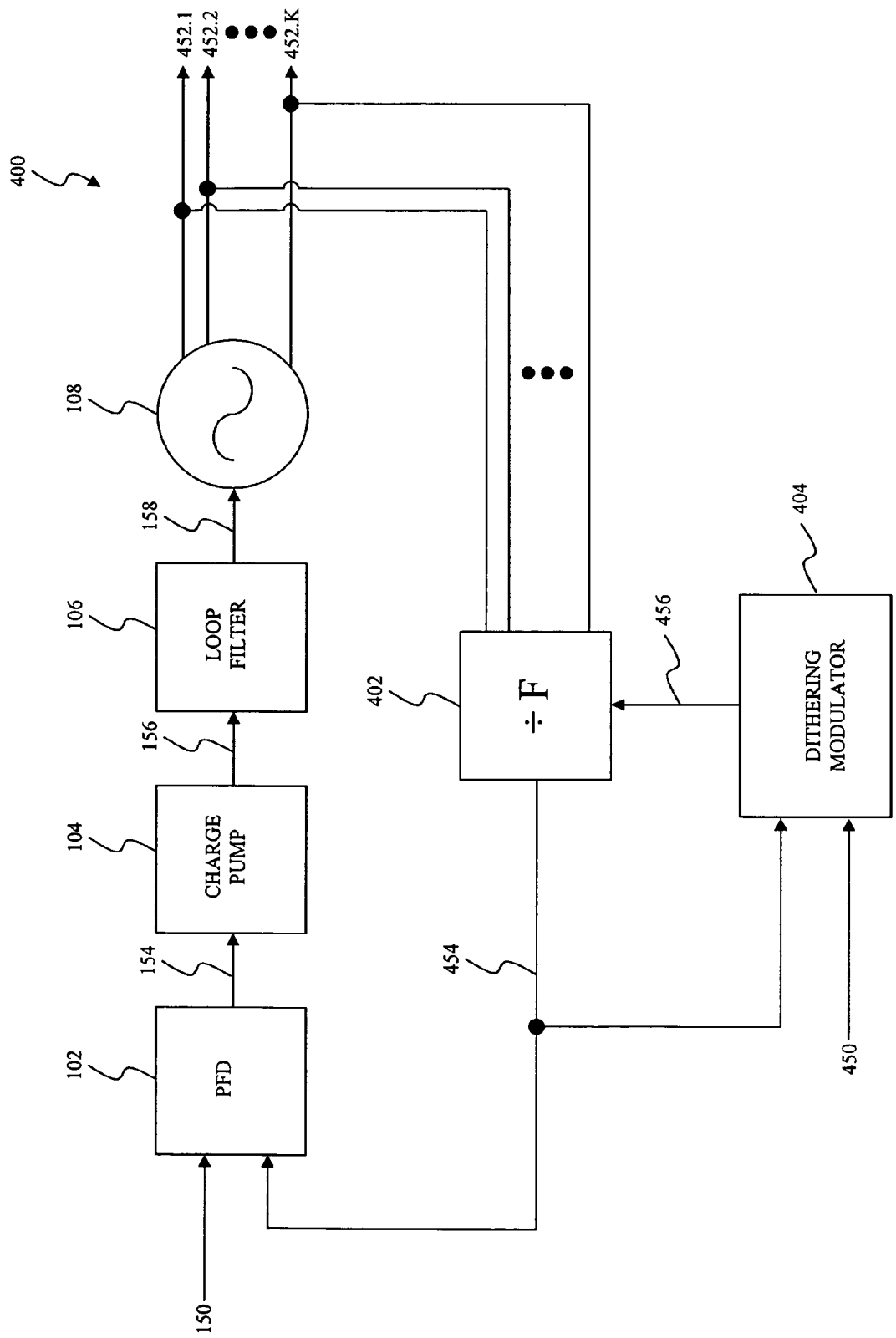
FIG. 4 is a block diagram of a fractional-N phase-locked loop according to another exemplary embodiment of the present invention.

FIG. 4 is a block diagram of a fractional-N phase-locked loop (PLL) according to a second exemplary embodiment of the present invention. The PLL 400 is a closed-loop feedback control system that generates a voltage controlled oscillator (VCO) output 452 in relation to the frequency and the phase of the reference signal 150. In other words, the PLL 400 performs frequency multiplication, via a negative feedback mechanism, to generate the VCO output 452 in terms of the reference signal 150. The PLL 400 may be implemented using the phase/frequency detector (PFD) 102, the charge pump 104, the optional loop filter 106, the voltage controlled oscillator (VCO) 108, a fractional frequency divider 402, and a dithering modulator 404.

As shown in FIG. 4, the PFD 102 converts the difference between the phase of the reference signal 150 and a phase of a divided feedback signal 454 into an error signal 154. More specifically, the PFD 102 produces the error signal 154 by comparing a frequency and the phase of the divided feedback signal 454 to the frequency and the phase of the reference signal 150 to detect for deviations between the phase and/or frequency of the reference signal 150 and the phase and/or frequency of the divided feedback signal 454. When the phase and the frequency of the reference signal 150 and the phase of the divided feedback signal 454 are substantially equivalent, the PLL 400 is in a locked condition. In the locked condition, the error signal 154 is proportional to the phase difference between the reference signal 150 and the divided feedback signal 454 minimizing the error signal 154.

The VCO 108 produces VCO outputs 452.1 through 452.K based upon the tuning signal 158. More specifically, the VCO 108 generates the VCO outputs 452.1 through 452.K to correct for deviations between the frequency and/or phase of the reference signal 150 and the divided feedback signal 454 based upon the tuning signal 158. In other words, the VCO 108 responds to the tuning signal 158 by automatically raising or lowering the frequency of the VCO outputs 452.1 through 452.K until the frequency of a corresponding VCO output 452 is matched to the reference signal 150 in both frequency and phase.

As shown in FIG. 4, the fractional frequency divider 402 uses all the VCO outputs 452.1 through 452.K to generate the divided feedback signal 454. In other words, the fractional frequency divider 402 may use each of VCO outputs 452.1 through 452.K separately or in conjunction with one another to obtain a true fractional division factor, denoted as F in FIG. 4. In other words, instead of randomly selecting between the two or more integer divide value to obtain the effective time averaged fractional division factor as with the conventional PLL 200, the PLL 400 obtains the true fractional division factor. For example, to achieve a fractional division factor of $$N + \frac{1}{2},$$

the PLL 200 divides the corresponding VCO output 452 by N for one iteration of the PLL 200 then divides the corresponding VCO output 452 by N+1 for a another iteration of the PLL 200, so that on average the corresponding voltage controlled VCO output 452 is divided by $$N + \frac{1}{2}.$$

In contrast, to achieve a fractional division factor of $$N + \frac{1}{2},$$

the PLL 400 divides the corresponding VCO output 452 by $$N + \frac{1}{2}$$

for each iteration of the PLL 400. In general the PLL 400 may generate other true fractional division factors of $$N \pm \frac{j}{K},$$

where j may be any integer value between 0 to K−1, by using each of VCO outputs 452.1 through 452.K separately or in conjunction with one another. For example, by using a VCO 108 having VCO outputs 452.1 through 452.4, the PLL 400 may generate true fractional division factors of 9.25, 9.5, 9.75, and 10 or 10, 10.25, 10.5 and 10.75 depending on whether the fractional portion j/K is added or subtracted from the integer value of 10.

The dithering modulator 404 dithers the divider control 456 between two or more consecutive fractional values based upon a modulator input control signal 450 and the divider output signal 454. Those skilled in the arts will recognize that any suitable means may be used to generate the divide control signal 356 without departing from the spirit and scope of the invention. The dithering modulator 404 may be implemented using an accumulator, a sigma-delta modulator, or any other suitable means to perform the dithering operation.

Noise generated by the VCO 108 and the dithering modulator 404 may be significant contributors towards phase noise and time domain jitter at the output of the PLL 400. The phase quantization noise of the PLL 300 and the PLL 400 is substantially less than the phase quantization noise of the PLL 200 having a substantially equivalent loop response. Using all available VCO outputs 352.1 through 352.K or VCO outputs 452.1 through 452.K substantially increases the frequency resolution of the PLL 300 and the PLL 400 when compared to the PLL 100 and/or the PLL 200. More specifically, using all available VCO outputs 352.1 through 352.K by the PLL 300 or VCO outputs 452.1 through 452.K by the PLL 400 increases the frequency resolution of the PLL 300 and the PLL 400 by a factor of K when compared to the PLL 100 and/or the PLL 200. The increase in frequency resolution of the PLL 300 and the PLL 400 reduces the phase quantization noise generated through the fractional frequency divider 302 or the fractional frequency divider 402 by K. In an exemplary embodiment, by using a VCO having eight phases, the frequency resolution of the PLL 400 is increased by a factor of eight when compared to the frequency resolution of the PLL 200. This increase in frequency resolution reduces the phase quantization noise generated by the fractional frequency divider 402 by ⅛ or 18 decibels (dB). Decreasing the phase quantization noise in this manner without adjusting the frequency response of the PLL 300 or the frequency response of the PLL 400 allows for a higher loop bandwidth for the PLL 300 and the PLL 400 when compared to the PLL 100 and/or the PLL 200.

Figure 5A:
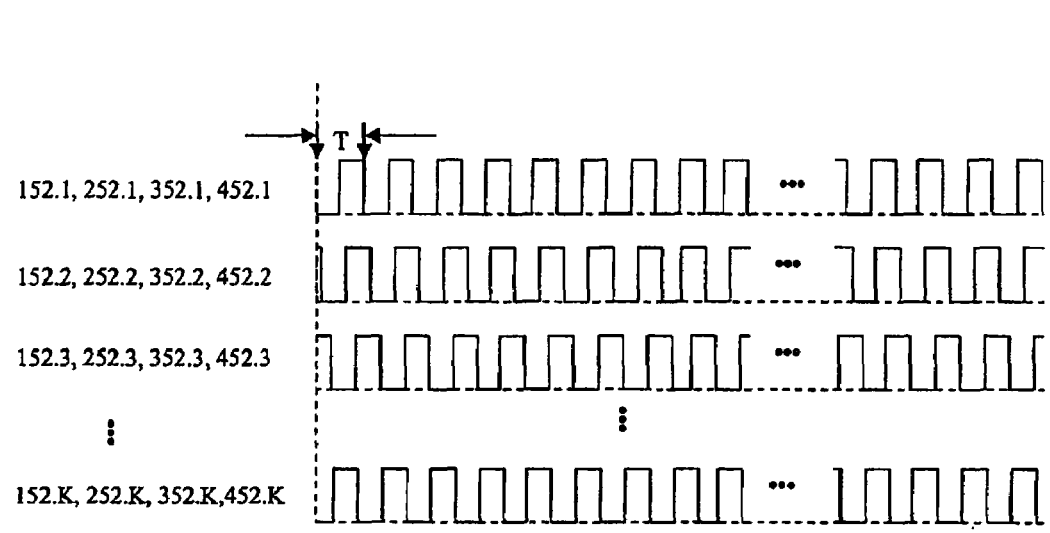
FIG. 5A is illustration of an exemplary time domain representation illustrating a multi-phase voltage controlled oscillator output signal generated by a multi-phase voltage controlled oscillator.

FIG. 5A is illustration of an exemplary time domain representation illustrating a multi-phase voltage controlled oscillator (VCO) output signal generated by a multi-phase VCO. The invention is not limited to the exemplary time domain representation 500. Rather, it will be apparent to persons skilled in the relevant art(s) from the teachings herein that other representations of the output of the multi-phase VCO are within the scope and spirit of the present invention.

A multi-phase VCO, such as the VCO 108, generates a multi-phase voltage controlled output signal, such as the VCO outputs 152, 252, 352, or 452 as shown in FIG. 1 through FIG. 4 respectively. As shown in FIG. 5A, a first signal of the multi-phase voltage controlled output signal, such as VCO outputs 152.1, 252.1, 352.1, or 452.1, has a periodicity of T. A second signal of the multi-phase voltage controlled output signal, such as VCO outputs 152.2, 252.2, 352.2, or 452.2, is substantially similar in frequency and magnitude as the first signal of the multi-phase voltage controlled output signal, but offset from the first signal of the multi-phase voltage controlled output signal. Similarly, a third signal of the multi-phase voltage controlled output signal, such as VCO outputs 152.3, 252.3, 352.3, or 452.3, is substantially similar in frequency and magnitude as the second signal of the multi-phase voltage controlled output signal, but offset from the second signal of the multi-phase voltage controlled output signal. Likewise, a $K^{th}$ signal of the multi-phase voltage controlled output signal, such as VCO outputs 152.K, 252.K, 352.K, or 452.K, is substantially similar in frequency and magnitude as the $(K-1)^{th}$ signal of the multi-phase voltage controlled output signal, but offset from the $(K-1)^{th}$ signal of the multi-phase voltage controlled output signal.

Figure 5B:
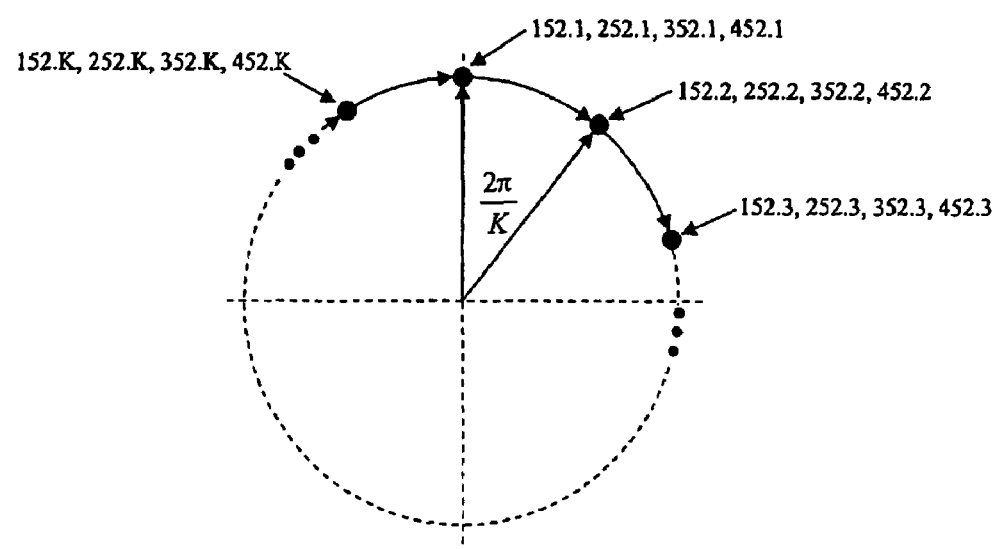
FIG. 5B is a diagram illustrating the phase relationship between voltage controlled oscillator outputs in a multi-phase voltage controlled oscillator output signal generated by a multi-phase voltage controlled oscillator.

FIG. 5B is a diagram 450 illustrating the phase relationship between voltage controlled oscillator (VCO) outputs in a multi-phase VCO signal generated by a multi-phase VCO. Each of the VCO outputs in the multi-phase VCO output signal, for example the VCO outputs 152.1 through 152.K, the VCO outputs 252.1 through 252.K, the VCO outputs 352.1 through 352.K or the VCO outputs 452.1 through 452.K, may be represented by a magnitude with a corresponding phase. The corresponding phases of the VCO outputs of the multi-phase VCO output signal may be plotted on a unit circle such that the sum of the corresponding phases of the VCO outputs of the multi-phase VCO output signal is equal to 2π. The phase offsets between adjacent multi-phase VCO output signals of the multi-phase VCO output signal are substantially equal and may be determined upon examination of the unit circle.

As shown in FIG. 5B, the VCO outputs are designated in a clockwise direction according to their relative offset in phase. Herein, the VCO outputs, such as VCO output 152.1 through 151.K, designated with a greater numerical suffix have a substantially lesser phase offset then those with a lesser numerical suffix. For example, the VCO output 152.2 has a substantially lesser offset in phase when compared to the VCO output 152.1, but has a substantially greater offset in phase when compared to the VCO output 152.3.

As shown in FIG. 5B, a phase of a first signal, such as the VCO outputs 152.1, 252.1, 352.1, or 452.1, of the multi-phase VCO output signal is offset from a phase of a second signal, such as the VCO outputs 152.2, 252.2, 352.2 or 452.2, of the multi-phase VCO output signal by $$\frac{2\pi}{K},$$

where K represents the total number of phases in the multi-phase VCO output signal. In an exemplary embodiment, a multi-phase VCO, such as the VCO 108 as shown in FIG. 4, may generate a multi-phase output signal having eight phase VCO outputs, such as VCO outputs 452.1 through 452.8. In this exemplary embodiment, a phase of a first signal of the multi-phase VCO output signal, such as VCO output 452.1, is offset from a phase of a second signal, such as VCO output 452.2, of the multi-phase VCO output signal by π/4.

Similarly, a phase of the second signal, such as VCO outputs 152.2, 252.2, 352.2, or 452.2, of the multi-phase VCO output signal is offset from a phase of a third signal, such as VCO outputs 152.3, 252.3, 352.3, or 452.3, of the multi-phase VCO output signal by $$\frac{2\pi}{K}.$$

From the exemplary embodiment presented above, a phase of a second signal of the multi-phase VCO output signal, such as VCO output 452.2, is offset from a phase of a third signal, such as VCO output 452.3, of the multi-phase VCO output signal by π/4.

Finally, a phase of a $K^{th}$ signal, such as the VCO outputs 152.K, 252.K, 352.K, or 452.K, of the multi-phase VCO output signal is offset from the phase of a first signal by $$\frac{2\pi}{K}.$$

From the exemplary embodiment presented above, a phase of a $8^{th}$ signal of the multi-phase VCO output signal, such as VCO output 452.8, is offset from the phase of the first signal of the multi-phase VCO output signal by π/4.

Although the VCO outputs 152.1 through 152.K, the VCO outputs 252.1 through 252.K, the VCO outputs 352.1 through 352.K or the VCO outputs 452.1 through 452.K have substantially equivalent phase offsets of $$\frac{2\pi}{K}$$

as shown in FIG. 5B, this is merely for demonstrative purposes only. Those skilled in art the will recognize that the VCO outputs 152.1 through 152.K, the VCO outputs 252.1 through 252.K, the VCO outputs 352.1 through 352.K, or the VCO outputs 452.1 through 452.K may have unequal phase offsets without departing from the spirit and scope of the invention.

Figure 6A:
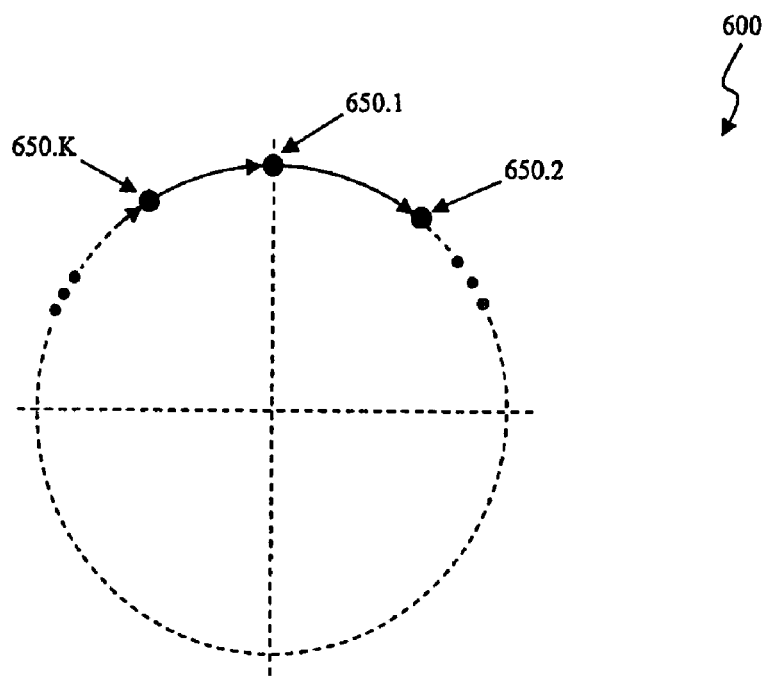
FIG. 6A is an illustration of a forward phase shifting operation according to an exemplary embodiment of the present invention.

FIG. 6A is an illustration 600 of a forward phase shifting operation according to an exemplary embodiment of the present invention. A multi-phase output of a voltage controlled oscillator (VCO), denoted as VCO outputs 650.1 through 650.K in FIG. 6A, may be plotted on a unit circle in a clockwise direction according to their relative offset in phase. The VCO outputs 650.1 through 650.K are an exemplary representation of the VCO outputs 352.1 through 352.K as shown in FIG. 3 or the VCO outputs 452.1 through 452.K as shown in FIG. 4.

In the forward phase shifting operation, a fractional frequency divider, such as the fractional frequency divider 302 or the fractional frequency divider 402, switches from a first VCO output, such as VCO output 650.1, to a second VCO output, such as VCO output 650.2, in a clockwise direction. In other words, the fractional frequency divider switches from a VCO output with a substantially greater phase offset, such as VCO output 650.1, to a VCO output with a substantially lesser phase offset, such as VCO output 650.2. The fractional frequency divider continues to switch among the VCO outputs 650.1 through 650.K in a similar manner until completing one full phase cycle of 2π. After completion of the one full phase cycle, the process repeats again starting from the first VCO output.

Figure 6B:
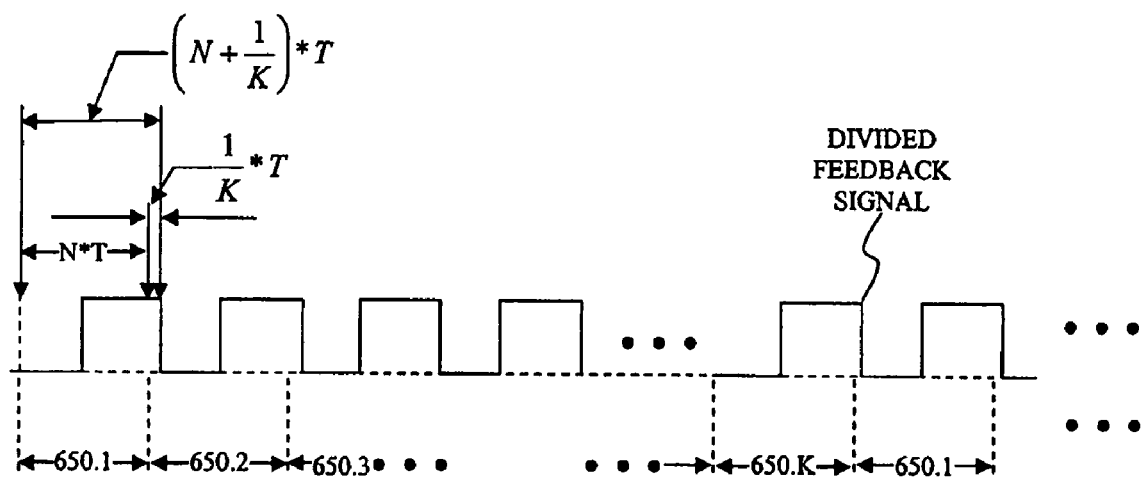
FIG. 6B is an exemplary time domain representation illustrating a divided feedback signal of a fractional-N phase-locked loop using a forward phase shifting operation according to a first exemplary embodiment of the present invention.

FIG. 6B is an exemplary time domain representation illustrating a divided feedback signal of a fractional-N phase-locked loop using a forward phase shifting operation according to a first exemplary embodiment of the present invention. More specifically, FIG. 6B is an exemplary illustration of a divided feedback signal, such as the divided feedback signal 354 or the divided feedback signal 454, as generated by a fractional frequency divider, such as the fractional frequency divider 302 or the fractional frequency divider 402, using the forward phase shifting operation. The fractional frequency divider may use all of VCO outputs, such as the VCO outputs 352.1 through 352.K or the VCO outputs 452.1 through 452.K, to generate the divided feedback signal. In other words, the fractional frequency divider may use the VCO outputs in their entirety to generate the divided feedback signal.

To generate the divided feedback signal, the fractional frequency divider multiplexes or selects among the VCO outputs 650.1 through 650.K in an incremental manner. For example, as shown in FIG. 6B, the fractional frequency divider selects the VCO output 650.1 for N clock periods. The fractional frequency divider then switches from the VCO output 650.1 to the VCO output 650.2 for N clock periods at a rising and/or a falling edge of the VCO output 650.2. In other words, the fractional frequency divider switches from the VCO output 650.1 upon reaching a low to a high or a high to a low transition of the VCO output 650.2. Although the forward phase shifting operation as shown FIG. 6B commences with the VCO output 650.1, this is merely for demonstrative purposes only. Those skilled in art the will recognize that the forward phase shifting operation of FIG. 6B may commence using any one of the VCO outputs 650.1 through 650.K without departing from the spirit and scope of the invention.

The fractional frequency divider may remain at the current value of the true fractional division factor by selecting among the VCO outputs 650.3 through 650.K in a similar forward or clockwise manner. This process of incrementally switching among the VCO outputs 650.1 through 650.k continues until the fractional frequency divider arrives at the VCO output 650.K. After switching from the VCO output 650.K, the fractional frequency divider switches from the VCO output 650.K to the VCO output 650.1 in accordance with FIG. 6A

In this exemplary embodiment, the incremental switching of the fractional frequency divider extends or increases the period of the divided feedback signal by $$\left(\frac{1}{K}\right)*T$$

when compared to the period of a conventional divided feedback signal, such as the divided feedback signal 158. In other words, the periodicity of the divided feedback signal is $$\left(N+\frac{1}{K}\right)*T,$$

whereas the periodicity of the conventional divided feedback signal is N*T. The value $$\left(N+\frac{1}{K}\right)$$

is an exemplary representation of the true fractional division factor as discussed in FIG. 3 and in FIG. 4.

In an exemplary embodiment, the fractional frequency divider uses a VCO output 650 having eight outputs, VCO outputs 650.1 through 650.8, to generate a true fractional division factor of $$\left(N+\frac{1}{8}\right)$$

by incrementally switching between the VCO outputs 650.1 through 650.8 in the manner as described above.

Figure 6C:
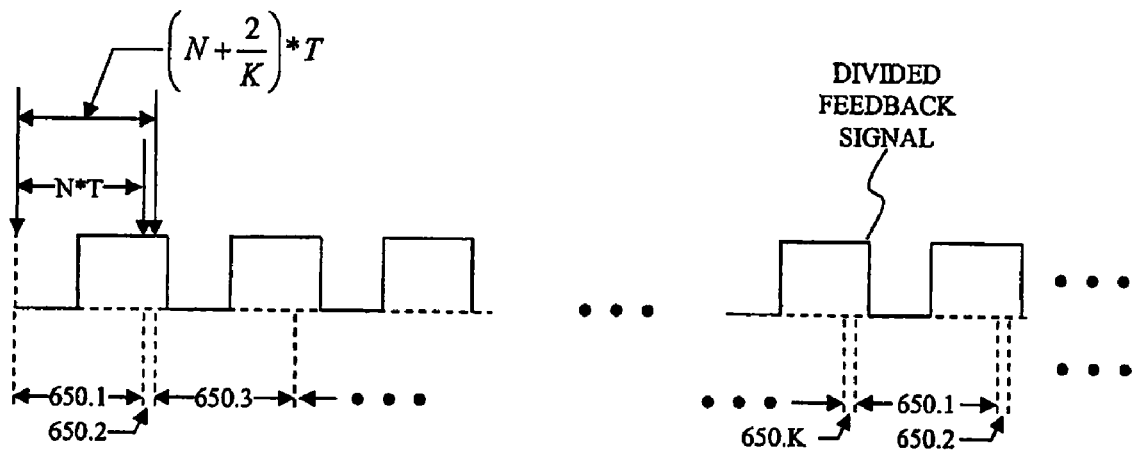
FIG. 6C is an exemplary time domain representation illustrating a divided feedback signal of a fractional-N phase-locked loop using a forward phase shifting operation according to a second exemplary embodiment of the present invention.

FIG. 6C is an exemplary time domain representation illustrating a divided feedback signal of a fractional-N phase-locked loop using a forward phase shifting operation according to a second exemplary embodiment of the present invention. More specifically, FIG. 6C is an exemplary illustration of a divided feedback signal, such as the divided feedback signal 354 or the divided feedback signal 454, as generated by a fractional frequency divider, such as the fractional frequency divider 302 or the fractional frequency divider 402, using the forward phase shifting operation.

Recalling the discussion of FIG. 3 and FIG. 4, the fractional frequency divider may use all of VCO outputs, such as VCO outputs 352.1 through 352.K or VCO outputs 452.1 through 452.K, to generate the divided feedback signal. In other words, the fractional frequency divider may use the VCO outputs in their entirety to generate the divided feedback signal.

To generate the divided feedback signal, the fractional frequency divider multiplexes or selects among the VCO outputs 650.1 through 650.K in an incremental manner. More specifically, the fractional frequency divider selects the VCO output 650.1 for N clock periods. The fractional frequency divider then incrementally switches from the VCO output 650.1 to the VCO output 650.2. The fractional frequency divider selects the VCO output 650.2 until a rising and/or falling edge of the VCO output 650.3. In other words, the fractional frequency divider switches from the VCO output 650.2 upon reaching a low to a high or a high to a low transition of the VCO output 650.3. Upon reaching the rising and/or the falling edge of the VCO output 650.3, the fractional frequency divider then incrementally switches from the VCO output 650.2 to the VCO output 650.3 and selects the VCO output 650.3 for N clock periods. Although the forward phase shifting operation as shown FIG. 6C commences with the VCO output 650.1, this is merely for demonstrative purposes only. Those skilled in art the will recognize that the forward phase shifting operation of FIG. 6C may commence using any one of the VCO outputs 650.1 through 650.K without departing from the spirit and scope of the invention.

The fractional frequency divider may remain at the current value of the true fractional division factor by selecting among the VCO outputs 650.4 through 650.K in a similar forward or clockwise manner. This process of incrementally switching among the VCO outputs 650.1 through 650.k continues until the fractional frequency divider arrives at the VCO output 650.K. After switching from VCO output 650.K, the fractional frequency divider switches from the VCO output 650.K to the VCO output 650.1 in accordance with FIG. 6A.

In this exemplary embodiment, the incremental switching of the fractional frequency divider extends or increases the period of the divided feedback signal by $$\left(\frac{2}{K}\right)*T$$

when compared to the period of a conventional divided feedback signal, such as divided feedback signal 158. In other words, the periodicity of the divided feedback signal is $$\left(N+\frac{2}{K}\right)*T,$$

whereas the periodicity of the conventional divided feedback signal is N*T. The value $$\left(N+\frac{2}{K}\right)$$

is an exemplary representation of the true fractional division factor as discussed in FIG. 3 and in FIG. 4.

In an exemplary embodiment, the fractional frequency divider uses a VCO output 650 having eight outputs, VCO outputs 650.1 through 650.8, to generate a true fractional division factor of $$\left(N + \frac{1}{4}\right)$$

by incrementally switching between VCO outputs 650.1 through 650.8 in the manner as described above.

Figure 6D:
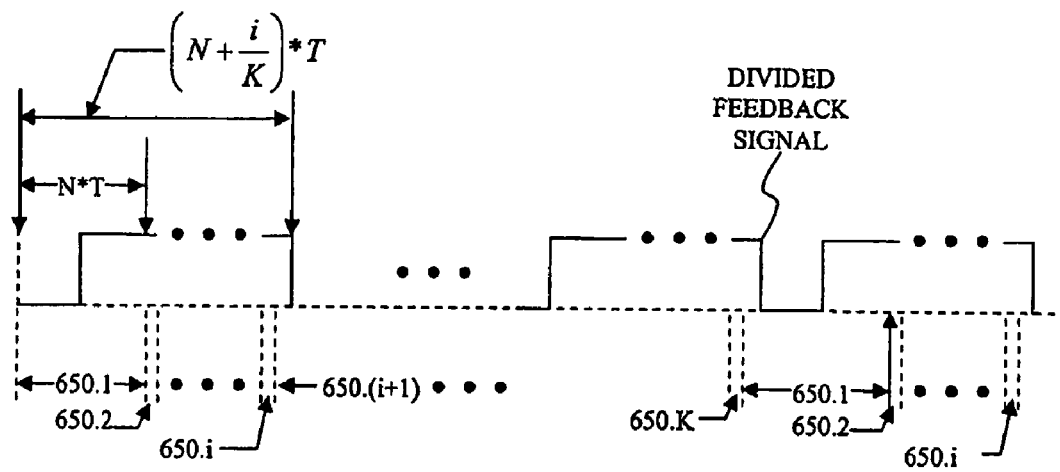
FIG. 6D is an exemplary time domain representation illustrating a divided feedback signal of a fractional-N phase-locked loop using a forward phase shifting operation according to a third exemplary embodiment of the present invention

FIG. 6D is an exemplary time domain representation illustrating a divided feedback signal of a fractional-N phase-locked loop using a forward phase shifting operation according to a second exemplary embodiment of the present invention. More specifically, FIG. 6D is an exemplary illustration of a divided feedback signal, such as the divided feedback signal 354 or the divided feedback signal 454, as generated by a fractional frequency divider, such as the fractional frequency divider 302 or the fractional frequency divider 402, using the forward phase shifting operation. Recalling the discussion of FIG. 3 and FIG. 4, the fractional frequency divider may use all of VCO outputs, such as VCO outputs 352.1 through 352.K or VCO outputs 452.1 through 452.K, to generate the divided feedback signal. In other words, the fractional frequency divider may use the VCO outputs in their entirety to generate the divided feedback signal.

To generate the divided feedback signal, the fractional frequency divider multiplexes or selects among the VCO outputs 650.1 through 650.K in an incremental manner. More specifically, the fractional frequency divider selects the VCO output 650.1 for N clock periods. The fractional frequency divider then incrementally switches from the VCO output 650.1 to the VCO output 650.2. The fractional frequency divider selects the VCO output 650.2 at a rising and/or a falling edge of the VCO output 650.2. In other words, the fractional frequency divider switches from the VCO output 650.2 upon reaching a low to a high or a high to a low transition of the VCO output 650.2. In general, the fractional frequency divider may incrementally switch from a first VCO output, such as VCO output 650.i, to a second VCO output, such as VCO output 650.2, at a rising and/or falling edge of the second VCO output for a total of i, where i represents an integer value between three and (K−2), times until the rising edge of the VCO output 650.(i+1). Upon reaching the rising and/or the falling edge of the VCO output 650.(i+1), the fractional frequency divider incrementally switches from the VCO output 650.i to the VCO output 650.(i+1) and remains at the VCO output 650.(i+1) for N clock periods. Although the forward phase shifting operation as shown FIG. 6D commences with the VCO output 650.1, this is merely for demonstrative purposes only. Those skilled in art the will recognize that the forward phase shifting operation of FIG. 6B may commence using any one of the VCO outputs 650.1 through 650.K without departing from the spirit and scope of the invention.

The fractional frequency divider may remain at the current value of the true fractional division factor by selecting among the VCO outputs 650.(i+2) through 650.K in a similar forward or clockwise manner. This process of incrementally switching among the VCO outputs 650.1 through 650.k continues until the fractional frequency divider arrives at the VCO output 650.K. After switching from VCO output 650.K, the fractional frequency divider switches from the VCO output 650.K to the VCO output 650.1 in accordance with FIG. 6A.

In this exemplary embodiment, the incremental switching of the fractional frequency divider extends or increases the period of the divided feedback signal by $$\left(\frac{i}{K}\right) * T$$

when compared to the period of a conventional divided feedback signal, such as divided feedback signal 158. In other words, the periodicity of the divided feedback signal is $$\left(N + \frac{i}{K}\right) * T,$$

whereas the periodicity of the conventional divided feedback signal is N*T. The value $$\left(N + \frac{i}{K}\right)$$

is an exemplary representation of the true fractional division factor as discussed in FIG. 3 and in FIG. 4.

In an exemplary embodiment, the fractional frequency divider uses a VCO output 650 having eight outputs, VCO output 650.1 through 650.8 to generate true fractional division factors of $$\left(N+\frac{1}{8}\right), \left(N+\frac{2}{8}\right), \left(N+\frac{3}{8}\right), \left(N+\frac{4}{8}\right), \left(N+\frac{5}{8}\right), \left(N+\frac{6}{8}\right), \text{ and } \left(N+\frac{7}{8}\right)$$

by switching between VCO outputs 650.1 through 650.8, in the manner as described above.

Figure 7A:
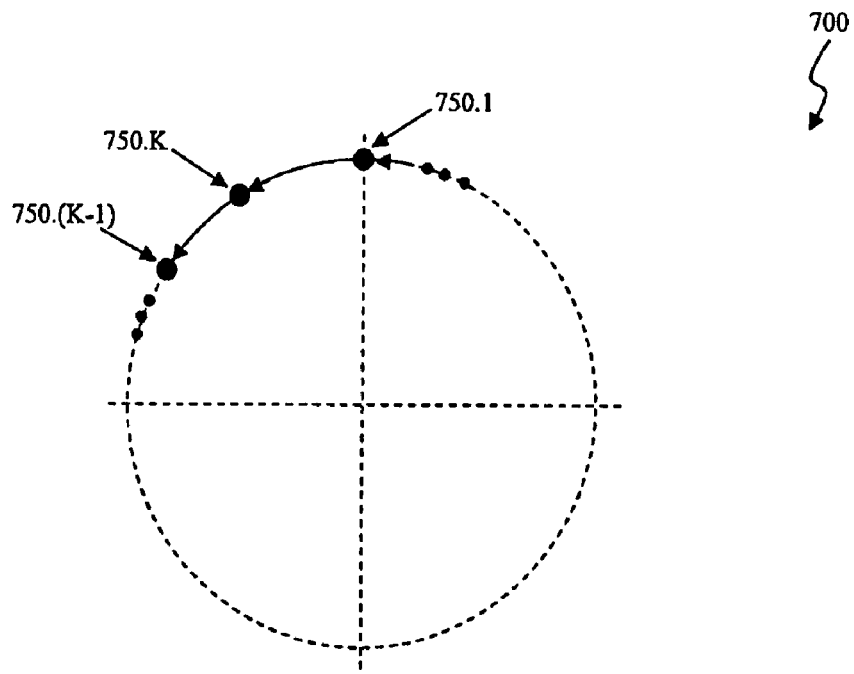
FIG. 7A is an illustration of a backward phase shifting operation according to an exemplary embodiment of the present invention.

FIG. 7A is an illustration 700 of a backward phase shifting operation according to an exemplary embodiment of the present invention. A multi-phase output of a voltage controlled oscillator (VCO), denoted as VCO outputs 750.1 through 750.K in FIG. 7A, may be plotted on a unit circle in a counter-clockwise direction according to their relative offset in phase. The VCO outputs 750.1 through 750.K are an exemplary representation of the VCO outputs 352.1 through 352.K as shown in FIG. 3 or the VCO outputs 452.1 through 452.K as shown in FIG. 4.

In the backward phase shifting operation, a fractional frequency divider, such as the fractional frequency divider 302 or the fractional frequency divider 402, switches from a first VCO output, such as VCO output 750.K, to a second VCO output, such as VCO output 750.(K−1), in a counter-clockwise direction. In other words, the fractional frequency divider switches from a VCO output with a substantially lesser phase offset, such as VCO output 750.K, to a VCO output with a substantially greater phase offset, such as VCO output 750.(K−1). The fractional frequency divider continues to switch among the VCO outputs 750.1 through 750.K in a similar manner until completing one full phase cycle of 2π. After completion of the one full phase cycle, the process repeats again starting from the first VCO output.

Figure 7B:
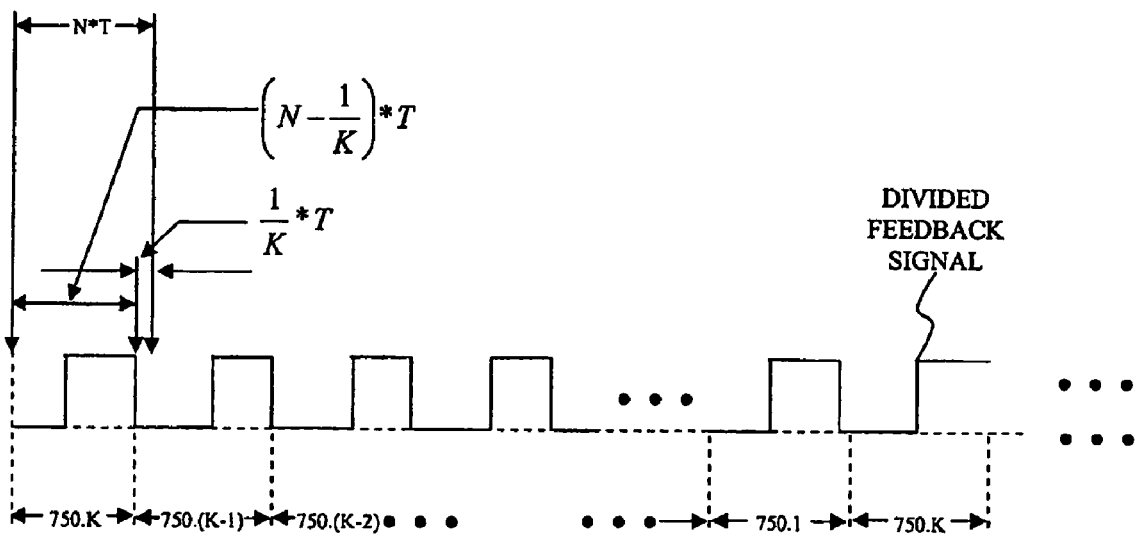
FIG. 7B is an exemplary time domain representation illustrating a divided feedback signal of a fractional-N phase-locked loop using a backward phase shifting operation according to a first exemplary embodiment of the present invention.

FIG. 7B is an exemplary time domain representation illustrating a divided feedback signal of a fractional-N phase-locked loop using a backward phase shifting operation according to a first exemplary embodiment of the present invention. More specifically, FIG. 7B is an exemplary illustration of a divided feedback signal, such as the divided feedback signal 354 or the divided feedback signal 454, as generated by a fractional frequency divider, such as the fractional frequency divider 302 or the fractional frequency divider 402, using the backward phase shifting operation. The fractional frequency divider may use all of VCO outputs, such as the VCO outputs 352.1 through 352.K or the VCO outputs 452.1 through 452.K, to generate the divided feedback signal. In other words, the fractional frequency divider may use the VCO outputs in their entirety to generate the divided feedback signal.

To generate the divided feedback signal, the fractional frequency divider multiplexes or selects among the VCO outputs 750.1 through 750.K in an incremental manner. For example, as shown in FIG. 7B, the fractional frequency divider selects the VCO output 750.K for N clock periods. The fractional frequency divider then switches from the VCO output 750.K to the VCO output 750.(K−1) for N clock periods at a rising and/or a falling edge of the VCO output 750.K. In other words, the fractional frequency divider switches from the VCO output 750.K upon reaching a low to a high or a high to a low transition of the VCO output 750.K. Although the backward phase shifting operation as shown FIG. 7B commences with the VCO output 750.K, this is merely for demonstrative purposes only. Those skilled in art the will recognize that the backward phase shifting operation of FIG. 7B may commence using any one of the VCO outputs 750.1 through 750.K without departing from the spirit and scope of the invention.

The fractional frequency divider may remain at the current value of the true fractional division factor by selecting among the VCO outputs selecting among the VCO outputs 750.1 through 750.K in a similar backward or counter-clockwise manner. This process of incrementally switching among the VCO outputs 750.1 through 750.K continues until the fractional frequency divider arrives at the VCO output 750.1. After switching from the VCO output 750.1, the fractional frequency divider switches from the VCO output 750.1 to the VCO output 750.K in accordance with FIG. 7A In this exemplary embodiment, the incremental switching of the fractional frequency divider reduces or decreases the period of the divided feedback signal by $$\left(\frac{1}{K}\right)*T$$

when compared to the period of a conventional divided feedback signal, such as the divided feedback signal 158. In other words, the periodicity of the divided feedback signal is $$\left(N-\frac{1}{K}\right)*T,$$

whereas the periodicity of the conventional divided feedback signal is N*T. The value $$\left(N-\frac{1}{K}\right)$$

is an exemplary representation of the true fractional division factor as discussed in FIG. 3 and in FIG. 4.

In an exemplary embodiment, the fractional frequency divider uses a VCO output 750 having eight outputs, VCO outputs 750.1 through 750.8, to generate a true fractional division factor of $$\left(N-\frac{1}{8}\right)$$

by incrementally switching between the VCO outputs 750.1 through 750.8 in the manner as described above.

Figure 7C:
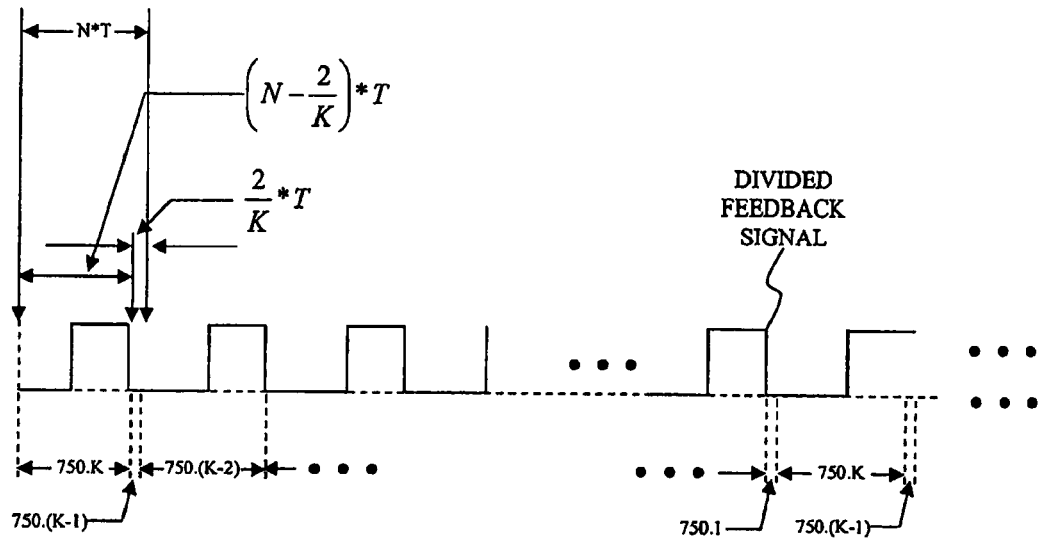
FIG. 7C is an exemplary time domain representation illustrating a divided feedback signal of a fractional-N phase-locked loop using a backward phase shifting operation according to a second exemplary embodiment of the present invention.

FIG. 7C is an exemplary time domain representation illustrating a divided feedback signal of a fractional-N phase-locked loop using a forward phase shifting operation according to a second exemplary embodiment of the present invention. More specifically, FIG. 7C is an exemplary illustration of a divided feedback signal, such as the divided feedback signal 354 or the divided feedback signal 454, as generated by a fractional frequency divider, such as the fractional frequency divider 302 or the fractional frequency divider 402, using the forward phase shifting operation. Recalling the discussion of FIG. 3 and FIG. 4, the fractional frequency divider may use all of VCO outputs, such as VCO outputs 352.1 through 352.K or VCO outputs 452.1 through 452.K, to generate the divided feedback signal. In other words, the fractional frequency divider may use the VCO outputs in their entirety to generate the divided feedback signal.

To generate the divided feedback signal, the fractional frequency divider multiplexes or selects among the VCO outputs 750.1 through 750.K in an incremental manner. More specifically, the fractional frequency divider selects the VCO output 750.K for N clock periods. The fractional frequency divider then incrementally switches from the VCO output 750.K to the VCO output 750.(K−1). The fractional frequency divider selects the VCO output 750.(K−1) at a rising and/or a falling edge of the VCO output 750.K.

In other words, the fractional frequency divider switches from the VCO output 750.K to VCO output 750.(K−1) upon reaching a low to a high or a high to a low transition of the VCO output 750.K. Upon reaching the rising and/or the falling edge of the VCO output 750.K, the fractional frequency divider then incrementally switches from the VCO output 750.K to the VCO output 750.(K−1) and selects the VCO output 750.(K−1) for N clock periods. Although the forward phase shifting operation as shown FIG. 7C commences with the VCO output 750.1, this is merely for demonstrative purposes only. Those skilled in art the will recognize that the forward phase shifting operation of FIG. 7C may commence using any one of the VCO outputs 750.1 through 750.K without departing from the spirit and scope of the invention.

The fractional frequency divider may remain at the current value of the true fractional division factor by selecting among the VCO outputs 750.1 through 750.K in a similar backward or counter-clockwise manner. This process of incrementally switching among the VCO outputs 750.1 through 750.K continues until the fractional frequency divider arrives at the VCO output 750.1. After switching from VCO output 750.1, the fractional frequency divider switches from the VCO output 750.1 to the VCO output 750.K in accordance with FIG. 7A.

In this exemplary embodiment, the incremental switching of the fractional frequency divider reduces or decreases the period of the divided feedback signal by $$\left(\frac{2}{K}\right)*T$$

when compared to the period of a conventional divided feedback signal, such as divided feedback signal 158. In other words, the periodicity of the divided feedback signal is $$\left(N-\frac{2}{K}\right)*T,$$

whereas the periodicity of the conventional divided feedback signal is N*T. The value $$N-\frac{2}{K}$$

is an exemplary representation of the true fractional division factor as discussed in FIG. 3 and in FIG. 4.

In an exemplary embodiment, the fractional frequency divider uses a VCO output 750 having eight outputs, VCO outputs 750.1 through 750.8, to generate true fractional division factor of $$\left(N-\frac{1}{4}\right)$$

by incrementally switching between VCO outputs 750.1 through 750.8 in the manner as described above.

Figure 7D:
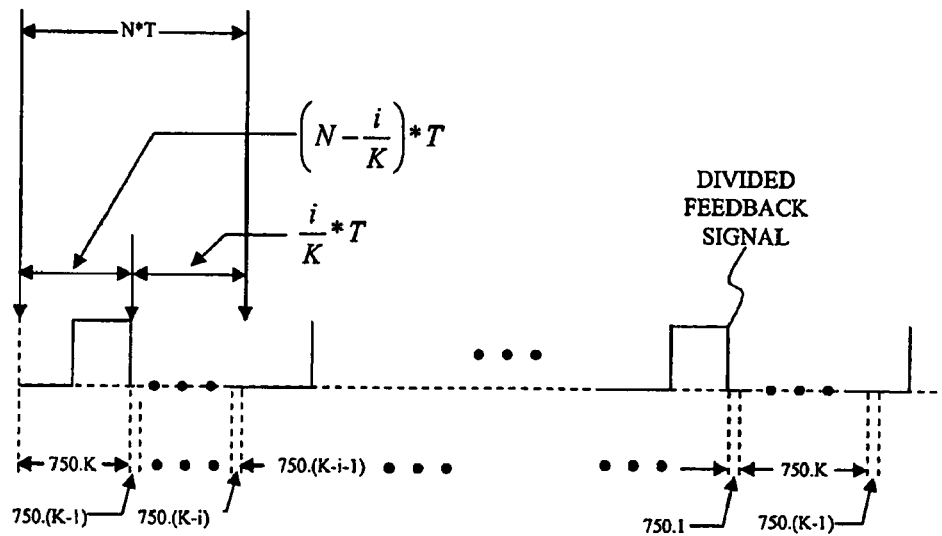
FIG. 7D is an exemplary time domain representation illustrating a divided feedback signal of a fractional-N phase-locked loop using a backward phase shifting operation according to an third exemplary embodiment of the present invention.

FIG. 7D is an exemplary time domain representation illustrating a divided feedback signal of a fractional-N phase-locked loop using a backward phase shifting operation according to a second exemplary embodiment of the present invention. More specifically, FIG. 7D is an exemplary illustration of a divided feedback signal, such as the divided feedback signal 354 or the divided feedback signal 454, as generated by a fractional frequency divider, such as the fractional frequency divider 302 or the fractional frequency divider 402, using the backward phase shifting operation. Recalling the discussion of FIG. 3 and FIG. 4, the fractional frequency divider may use all of VCO outputs, such as VCO outputs 352.1 through 352.K or VCO outputs 452.1 through 452.K, to generate the divided feedback signal. In other words, the fractional frequency divider may use the VCO outputs in their entirety to generate the divided feedback signal.

To generate the divided feedback signal, the fractional frequency divider multiplexes or selects among the VCO outputs 750.1 through 750.K in an incremental manner. More specifically, the fractional frequency divider selects the VCO output 750.K for N clock periods. The fractional frequency divider then incrementally switches from the VCO output 750.K to the VCO output 750.(K−1). The fractional frequency divider selects the VCO output 750.2 at a rising and/or a falling edge of the VCO output 750.K. In other words, the fractional frequency divider switches from the VCO output 750.(K−1) upon reaching a low to a high or a high to a low transition of the VCO output 750.K. In general, the fractional frequency divider may incrementally switch from a first VCO output, such as VCO output 750.(K−i), to a second VCO output, such as VCO output 750.(K−i−1), at a rising and/or falling edge of the second VCO output for a total of i, where i represents an integer value between two and (K−3), times until the rising edge of the VCO output 750.(K−i−1). Upon reaching the rising and/or the falling edge of the VCO output 750.(K−i−1), the fractional frequency divider incrementally switches from the VCO output 750.(K−i) to the VCO output 750.(K−i−1) and remains at the VCO output 750.(K−i−1) for N clock periods. Although the backward phase shifting operation as shown FIG. 7D commences with the VCO output 750.K, this is merely for demonstrative purposes only. Those skilled in art the will recognize that the backward phase shifting operation of FIG. 7D may commence using any one of the VCO outputs 750.1 through 750.K without departing from the spirit and scope of the invention.

The fractional frequency divider may remain at the current value of the true fractional division factor by selecting among the VCO outputs 750.1 through 750.K in a similar backward or counter-clockwise manner. This process of incrementally switching among the VCO outputs 750.1 through 750.k continues until the fractional frequency divider arrives at the VCO output 750.1. After switching from VCO output 750.K, the fractional frequency divider switches from the VCO output 750.K to the VCO output 750.1 in accordance with FIG. 7A.

In this exemplary embodiment, the incremental switching of the fractional frequency divider reduces or decreases the period of the divided feedback signal by $$\left(\frac{i}{K}\right)*T$$

when compared to the period of a conventional divided feedback signal, such as divided feedback signal 158. In other words, the periodicity of the divided feedback signal is $$\left(N-\frac{i}{K}\right)*T,$$

whereas the periodicity of the conventional divided feedback signal is N*T. The value $$\left(N-\frac{i}{K}\right)$$

is an exemplary representation of the true fractional division factor as discussed in FIG. 3 and in FIG. 4.

In an exemplary embodiment, the fractional frequency divider uses a VCO output 750 having eight outputs, VCO output 750.1 through 750.8 to generate a fractional division factors of $\left(N-\frac{7}{8}\right), \left(N-\frac{6}{8}\right), \left(N-\frac{5}{8}\right), \left(N-\frac{4}{8}\right), \left(N-\frac{3}{8}\right), \left(N-\frac{2}{8}\right), \text{and} \left(N-\frac{1}{8}\right),$ by switching between VCO outputs 750.1 through 750.8, in the manner as described above.

Figure 8A:
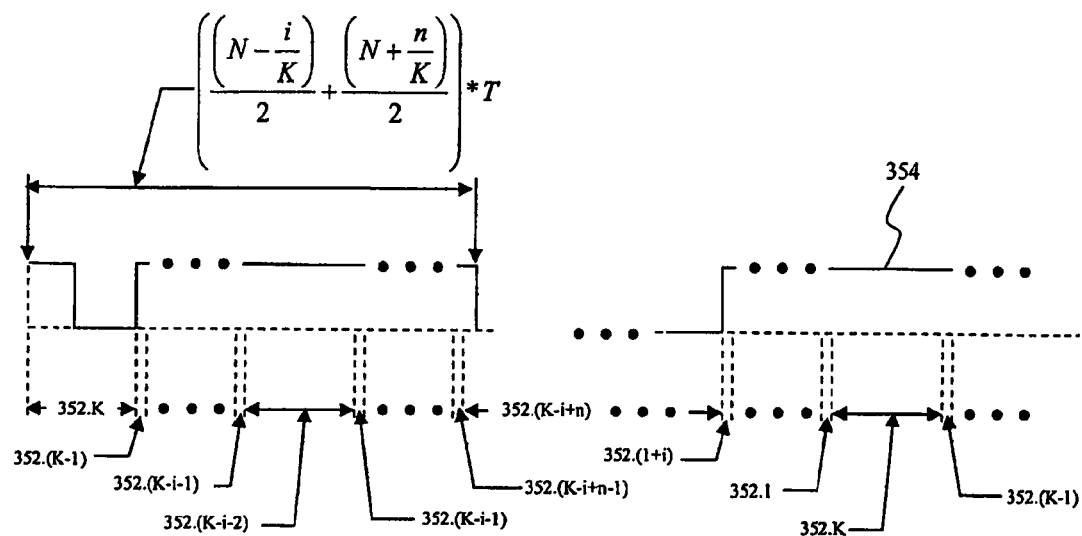
FIG. 8A is an exemplary time domain representation illustrating a divided feedback signal of a fractional-N phase-locked loop using a combined backward and forward phase shifting operation according to a exemplary embodiment of the present invention.

FIG. 8A is an exemplary time domain representation illustrating a divided feedback signal of a fractional-N phase-locked loop using a combined backward and forward phase shifting operation according to a exemplary embodiment of the present invention. More specifically, FIG. 8A is an exemplary illustration of the divided feedback signal 354 as generated by the fractional frequency divider 302, as shown in FIG. 3, using a combined backward and forward phase shifting operation. Recalling the discussion of FIG. 3, the fractional frequency divider 302 may use all of the VCO outputs 352.1 through 352.K to generate the divided feedback signal 354. In other words, the fractional frequency divider 302 may use the VCO 352 in its entirety to generate the divided feedback signal 354.

To generate the divided feedback signal 354, the fractional frequency divider 302 multiplexes or selects among the VCO outputs 352.1 through 352.K in an incremental manner. More specifically, the fractional frequency divider 302 selects the VCO output 352.K for N clock periods. The fractional frequency divider 302 then incrementally switches in a backward phase shifting operation from the VCO output 352.K to the VCO output 352.(K−1). The fractional frequency divider 302 selects the VCO 352.(K−1) until the rising edge of the VCO output 352.(K−1). In other words, the fractional frequency divider 302 switches from the VCO output 352.(K−1) upon reaching the low to high transition of the VCO output 352.(K−1). The fractional frequency divider 302 may incrementally switch from a first VCO output to a second VCO output until the rising edge of the second VCO output for a total of i, where i represents an integer value between one and (K−2), times until the rising edge of the VCO output 352.(K−i−1). The fractional frequency divider 302 then incrementally switches from the VCO output 352.(K−i−1) to the VCO output 352.(K−j−i−2) and selects the VCO output 352.(K−i−2). The fractional frequency divider 302 then incrementally switches in a forward phase shifting operation from the VCO output 352.(K−i−2) to the VCO output 352.(K−i−1). The fractional frequency divider 302 selects the VCO output 352.(K−i−1) until the falling edge of the VCO output 352.(K−i−1). In other words, the fractional frequency divider 302 switches from the VCO output 352.(K−1) upon reaching the high to low transition of the VCO output 352.(K−i−1). The fractional frequency divider 302 may incrementally switch from a first VCO output to a second VCO output until the falling edge of the second VCO output for a total of n, where n represents an integer value between one and (K−2), times until the rising edge of the VCO output 352.(K−i+n−1). The fractional frequency divider 302 then incrementally switches from the VCO output 352.(K−i+n−1) to the VCO output 352.(K−i+n−1) and selects the VCO output 352.((K−i+n) for N clock periods.

In this exemplary embodiment, the periodicity of the divided feedback signal 354 is $\left(\frac{\left(N-\frac{i}{K}\right)}{2} + \frac{\left(N+\frac{n}{K}\right)}{2}\right) * T,$ whereas the periodicity of the divided feedback signal 158 is N*T. The value $\frac{\left(N-\frac{i}{K}\right)}{2} + \frac{\left(N+\frac{n}{K}\right)}{2}$ represents the fractional division factor as discussed in FIG. 3.

This process of incrementally switching among the oscillator outputs continues until the fractional frequency divider 302 arrives at the VCO output 352.K. After selecting the VCO output 352.K, the fractional frequency divider 302 incrementally switches from the VCO output 352.K to the VCO output 352.1 in accordance with FIG. 6A and/or FIG. 7A. The location of the VCO output 352.K as shown in FIG. 8A is merely for demonstrative purposes only, those skilled in the art will recognize that the fractional frequency divider 302 may switch to the VCO output 352.K at any time in accordance with FIG. 6A and/or FIG. 7A without departing from the spirit and scope of the invention.

Figure 8B:
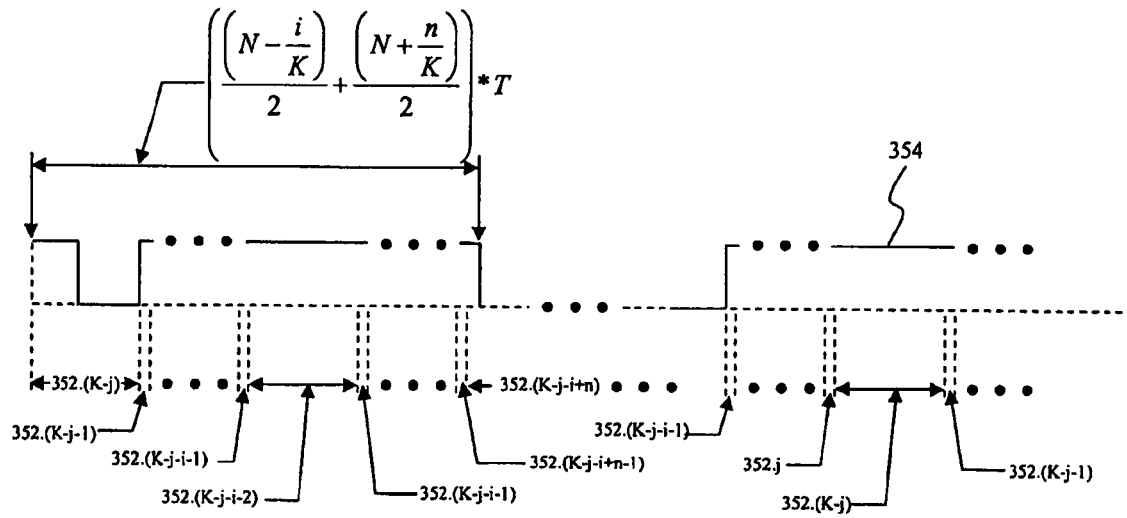
FIG. 8B is an exemplary time domain representation illustrating a divided feedback signal of a fractional-N phase-locked loop using a combined backward and forward phase shifting operation according to another exemplary embodiment of the present invention.

FIG. 8B is an exemplary time domain representation illustrating a divided feedback signal of a fractional-N phase-locked loop using a combined backward and forward phase shifting operation according to another exemplary embodiment of the present invention. More specifically, FIG. 8B is an exemplary illustration of the divided feedback signal 354 as generated by the fractional frequency divider 302, as shown in FIG. 3, using a combined backward and forward phase shifting operation. Recalling the discussion of FIG. 3, the fractional frequency divider 302 may use all of the VCO outputs 352.1 through 352.K to generate the divided feedback signal 354. In other words, the fractional frequency divider 302 may use the VCO output 352 in its entirety to generate the divided feedback signal 354.

To generate the divided feedback signal 354, the fractional frequency divider 302 multiplexes or selects among the VCO outputs 352.1 through 352.K in an incremental manner. More specifically, the fractional frequency divider 302 selects the VCO output 352.(K−j) for N clock periods. The fractional frequency divider 302 then incrementally switches in a backward phase shifting operation from the VCO output 352.(K−j) to the VCO output 352.(K−j−1). The fractional frequency divider 302 selects the VCO output 352.(K−j−1) until the rising edge of the VCO output 352.(K−j−1). In other words, the fractional frequency divider 302 switches from the VCO output 352.(K−j−1) upon reaching the low to high transition of the VCO output 352.(K−j−1). The fractional frequency divider 302 may incrementally switch from a first VCO output to a second VCO output until the rising edge of the second VCO output for a total of i, where i represents an integer value between one and (K−2), times until the rising edge of the VCO output 352.(K−j−i−1). The fractional frequency divider 302 then incrementally switches from the VCO output 352.(K−j−i−1) to the VCO output 352.(K−j−i−2) and selects the VCO output 352.(K−j−i−2). The fractional frequency divider 302 then incrementally switches in a forward phase shifting operation from the VCO output 352.(K−j−i−2) to the VCO output 352.(K−j−i−1). The fractional frequency divider 302 selects the VCO output 352.(K−j−i−1) until the falling edge of the VCO output 352.(K−j−i−1). In other words, the fractional frequency divider 302 switches from the VCO output 352.(K−j−1) upon reaching the high to low transition of the VCO output 352.(K−j−i−1). The fractional frequency divider 302 may incrementally switch from a first VCO output to a second VCO output until the falling edge of the second VCO output for a total of n, where n represents an integer value between one and (K−2), times until the rising edge of the VCO output 352.(K−j−i+n−1). The fractional frequency divider 302 then incrementally switches from the VCO output 352.(K−j−i+n−1) to the VCO output 352.(K−j−i+n−1) and selects the VCO output 352.((K−j−i+n) for N clock periods.

In this exemplary embodiment, the periodicity of the divided feedback signal 354 is $$\left(\frac{\left(N-\frac{i}{K}\right)}{2}+\frac{\left(N+\frac{n}{K}\right)}{2}\right)*T,$$

whereas the periodicity of the divided feedback signal 158 is N*T. The value $$\frac{\left(N-\frac{i}{K}\right)}{2}+\frac{\left(N+\frac{n}{K}\right)}{2}$$

represents the fractional division factor as discussed in FIG. 3.

The fractional frequency divider 302 may remain at the current fractional division factor by selecting among the VCO outputs in a backward or counter-clockwise manner as shown in FIG. 7A followed by a forward or clockwise manner as shown in FIG. 6A. This process of incrementally switching among the oscillator outputs continues until the fractional frequency divider 302 arrives at the VCO output 352.K. After selecting the VCO output 352.K, the fractional frequency divider 302 incrementally switches from the VCO output 352.K to the VCO output 352.1 in accordance with FIG. 6A and/or FIG. 7A. The location of the VCO output 352.K as shown in FIG. 8B is merely for demonstrative purposes only, those skilled in the art will recognize that the fractional frequency divider 302 may switch to the VCO output 352.K at any time in accordance with FIG. 6A and/or FIG. 7A without departing from the spirit and scope of the invention.

Figure 9A:
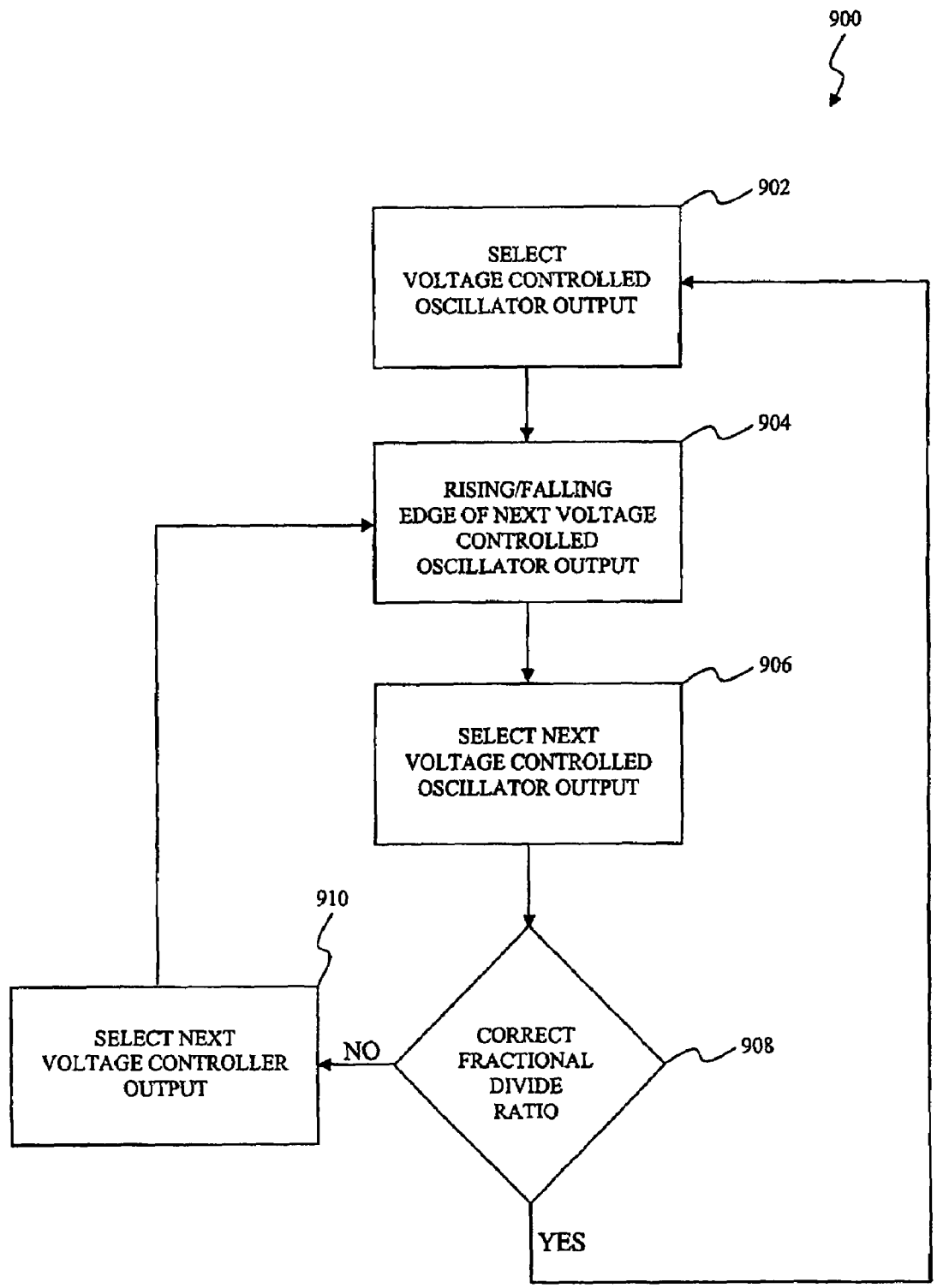
FIG. 9A is a flowchart of exemplary operational steps of a fractional frequency divider of a fractional-N phase-locked loop using a forward phase shifting operation according to a first exemplary embodiment of the present invention.

FIG. 9A is a flowchart 900 of exemplary operational steps of a fractional frequency divider of a fractional-N phase-locked loop using a forward phase shifting operation according to a first exemplary embodiment of the present invention. The invention is not limited to this operational description. Rather, it will be apparent to persons skilled in the relevant art(s) from the teachings herein that other operational control flows are within the scope and spirit of the present invention. The following discussion describes the steps in FIG. 9A.

Referring back to FIG. 9A, the fractional frequency divider generates the divided feedback signal by dividing the corresponding voltage controlled oscillator (VCO) output by a true fractional division factor. More specifically, the fractional frequency divider generates the true fractional division factor by selecting among all the VCO outputs in a forward or clockwise direction as shown in FIG. 6A.

At step 902, the fractional frequency divider selects a VCO output among all the VCO outputs generated by a multi-phase VCO. This VCO output is chosen for a duration of (N−j) clock cycles, where j represents the fractional portion, or in other words represents the number of incremental phase transitions required to achieve the desired fractional value.

At step 904, the fractional frequency divider selects the VCO output selected in step 902 until reaching a rising and/or a falling edge of the next VCO output having a next lesser phase offset. For example, the fractional frequency divider searches for a low to a high or a high to a low transition of the VCO output 650.2 when the VCO output 650.1 is selected in step 902.

At step 906, the fractional frequency divider switches from the VCO output selected in step 902 to the next VCO output with a substantially lesser phase offset upon reaching the rising and/or falling edge of the next VCO output in accordance with FIG. 6A. For example, in the forward phase shifting operation, the fractional frequency divider incrementally switches from a first VCO output, such as the VCO output 650.1, to a second VCO output, such as the VCO output 650.2, in a clockwise direction. In other words, the fractional frequency divider incrementally switches from a VCO output with a substantially greater phase offset, such as the VCO output 650.1, to a VCO output with a substantially lesser phase offset, such as the VCO output 650.2.

At step 908, the fractional frequency divider determines if the generation of the fractional division factor requires selecting additional VCO outputs. For example, to generate a fractional division factor of $$\left(N+\frac{1}{8}\right)$$

requires the fractional frequency divider to switch only once during N cycles of the VCO as shown in FIG. 6B. On the other hand, to generate a fractional division factor of $$\left(N+\frac{1}{4}\right)$$

requires the fractional frequency divider to increment twice as shown in FIG. 6C.

If the generation of the fractional value requires no additional selecting among the VCO outputs, the fractional frequency divider reverts back to step 902, else the fractional frequency divider proceeds to step 910.

At step 910, the generation of the true fractional division factor requires the fractional frequency divider to switch among additional VCO outputs. The fractional frequency divider incrementally switches from the VCO output selected in step 906 to an VCO output with a substantially greater phase offset in accordance with FIG. 6A. For example, in the forward phase shifting operation, the fractional frequency divider incrementally switches from a first voltage controlled VCO output, such as the VCO output 650.1, to a second VCO output, such as voltage controlled VCO output 650.2, in a clockwise direction. In other words, the fractional frequency divider incrementally switches from a VCO output with a substantially greater phase offset, such as the VCO output 650.1, to a VCO output with a substantially lesser phase offset, such as the VCO output 650.2.

Figure 9B:
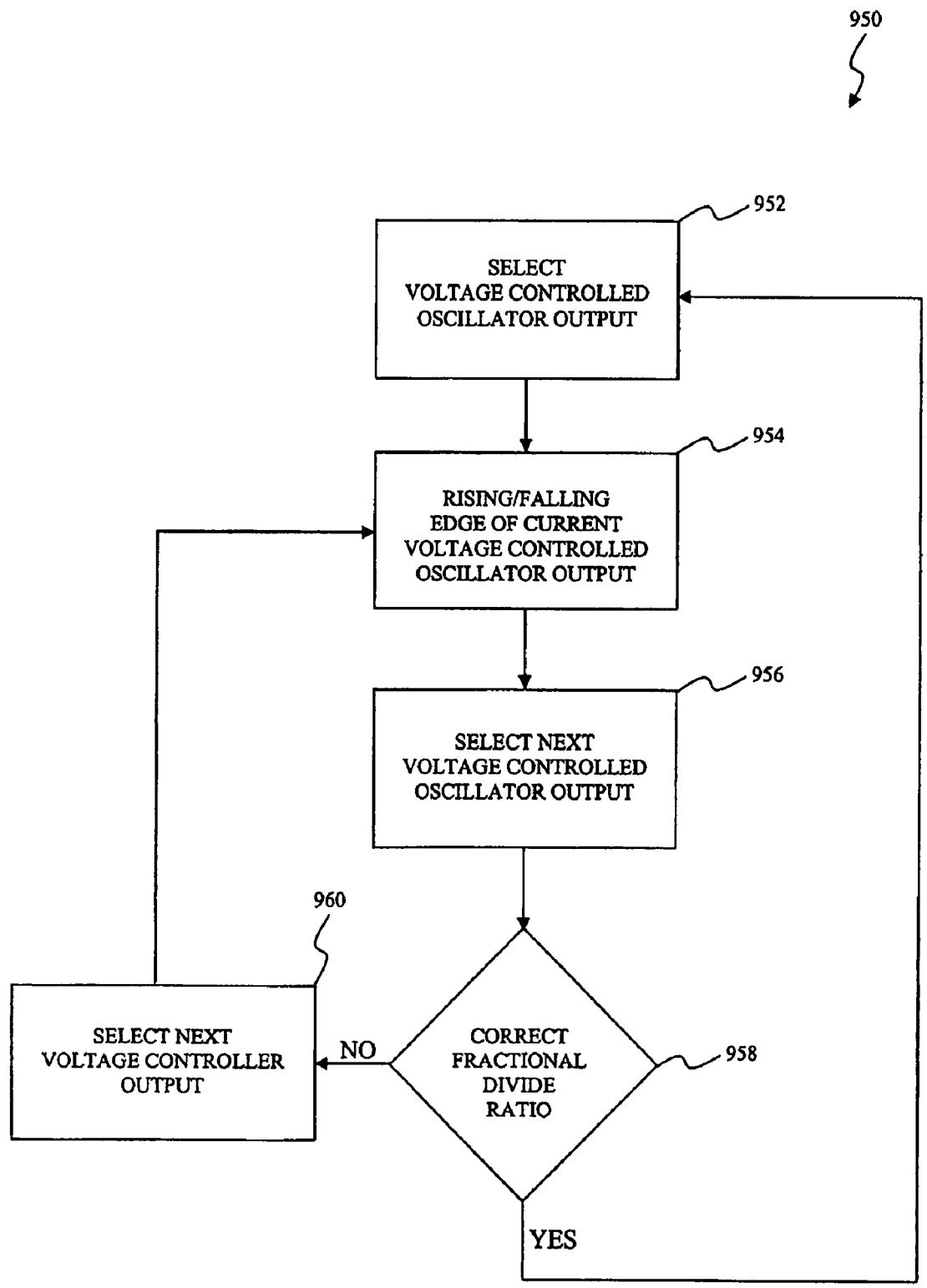
FIG. 9B is a flowchart of exemplary operational steps of a fractional frequency divider of a fractional-N phase-locked loop using a backward phase shifting operation according to a first exemplary embodiment of the present invention.

FIG. 9B is a flowchart 950 of exemplary operational steps of a fractional frequency divider of a fractional-N phase-locked loop using a backward phase shifting operation according to a first exemplary embodiment of the present invention. The invention is not limited to this operational description. Rather, it will be apparent to persons skilled in the relevant art(s) from the teachings herein that other operational control flows are within the scope and spirit of the present invention. The following discussion describes the steps in FIG. 9B.

Referring back to FIG. 9B, the fractional frequency divider generates the divided feedback signal by dividing the corresponding voltage controlled VCO (VCO) output by a true fractional division factor. More specifically, the fractional frequency divider generates the true fractional division factor by selecting among all the VCO outputs in a backward or counter-clockwise direction as shown in FIG. 7A.

At step 952, the fractional frequency divider selects a VCO output among all the VCO outputs generated by a multi-phase VCO. This VCO output is chosen for a duration of (N−j) clock cycles, where j represents the fractional portion, or in other words represents the number of incremental phase transitions required to achieve the desired fractional value.

At step 954, the fractional frequency divider selects the VCO output selected in step 952 until reaching a rising and/or a falling edge of the VCO output selected in step 952. For example, the fractional frequency divider searches for a low to a high or a high to a low transition of the VCO output 750.1 when the VCO output 750.1 is selected in step 952.

At step 956, the fractional frequency divider switches from the VCO output selected in step 952 to the next VCO output with a substantially greater phase offset upon reaching the rising and/or falling edge of the VCO output selected in step 952 in accordance with FIG. 7A. For example, in the backward phase shifting operation, the fractional frequency divider incrementally switches from a first VCO output, such as the VCO output 750.K, to a second VCO output, such as the VCO output 750.(K−1), in a counter-clockwise direction. In other words, the fractional frequency divider incrementally switches from a VCO output with a substantially lesser phase offset, such as the VCO output 750.K, to a VCO output with a substantially greater phase offset, such as the VCO output 750.(K−1).

At step 958, the fractional frequency divider determines if the generation of the fractional division factor requires selecting additional VCO outputs. For example, to generate a fractional division factor of $$\left(N - \frac{1}{8}\right)$$

requires the fractional frequency divider to switch only once during N cycles of the VCO as shown in FIG. 7B. On the other hand, to generate a fractional division factor of $$\left(N - \frac{1}{4}\right)$$

requires the fractional frequency divider to increment twice as shown in FIG. 7C.

If the generation of the fractional value requires no additional selecting among the VCO outputs, the fractional frequency divider reverts back to step 952, else the fractional frequency divider proceeds to step 960.

At step 960, the generation of the fractional frequency divider requires using additional VCO outputs. The fractional frequency divider incrementally switches from the VCO output selected in step 956 to an VCO output with a substantially lesser phase offset in accordance with FIG. 7A. For example, in the backward phase shifting operation, the fractional frequency divider incrementally switches from a first VCO output, such as the VCO output 750.K, to a second VCO output, such as the VCO output 750.(K−1), in a counter-clockwise direction. In other words, the fractional frequency divider incrementally switches from a VCO output with a substantially lesser phase offset, such as the VCO output 750.K, to a VCO output with a substantially greater phase offset, such as the VCO output 750.(K−1).

Figure 10A:
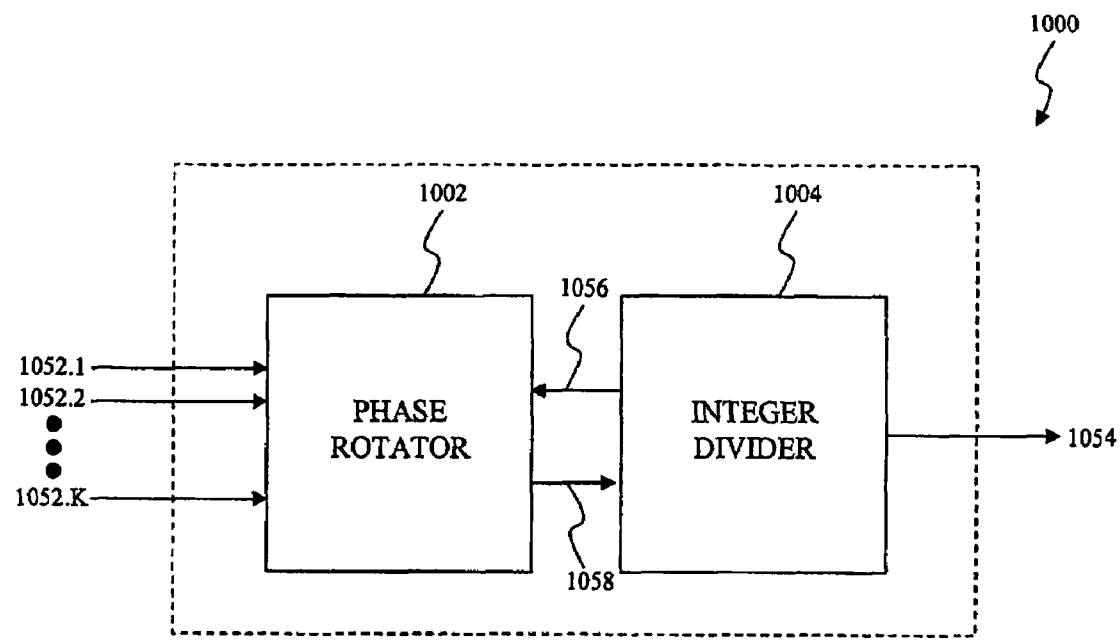
FIG. 10A illustrates a block diagram of a fractional frequency divider according to an exemplary embodiment of the present invention.

FIG. 10A illustrates a block diagram of a fractional frequency divider according to an exemplary embodiment of the present invention. The fractional frequency divider 1000 is an exemplary embodiment of the fractional frequency divider 302 as shown in FIG. 3 or the fractional frequency divider 402 as shown in FIG. 4. As shown in FIG. 10A, the fractional frequency divider 1000 receives the voltage controlled oscillator (VCO) outputs 1052.1 through 1052.K to generate the divided feedback signal 1054. Those skilled in the arts will recognize that the VCO outputs 1052.1 through 1052.K may be an exemplary representation of the VCO outputs 352.1 through 352.K as shown in FIG. 3 or the VCO outputs 452.1 through 452.K as shown in FIG. 4 without departing from the spirit and scope of the invention.

The fractional frequency divider 1000 includes a phase rotator 1002 to select among the VCO outputs 1052.1 through 1052.K. More specifically, the phase rotator 1002 selects among the VCO outputs 1052.1 through 1052.K to generate a clock 1058 in accordance with the backward and forward phase shifting operations.

An integer divider 1004 generates a divided feedback signal 1054 based upon the clock 1058. Those skilled in the arts will recognize that the divided feedback signal 1054 may be an exemplary representation of the divided feedback signal 354 as shown in FIG. 3 or the divided feedback signal 454 as shown in FIG. 4 without departing from the spirit and scope of the invention. In general, the integer divider 1004 is a programmable divider circuit that may select a specific integer divide ratio from a predetermined range of integer divide ratios. In an exemplary embodiment, the integer divider 1004 may select a specific integer divide ratio from 8 to 512. Further discussion of the integer divider 1004 is given in U.S. patent application Ser. No. 11/207,207, entitled "Method and System for a Digital Frequency Divider," filed on Aug. 8, 2005, which is incorporated by reference in its entirety.

In addition to generating the divided feedback signal 1054, the integer divider 1004 also generates a reset 1056 to be used by the phase rotator 1002. The phase rotator 1002 may use the reset 1056 to refresh the setting of the fractional divider 1000, to indicate one full period of the fractional divider output 1054, to allow for the changing of true fractional division factor at every cycle of divider output, or for any other suitable means to provide some examples.

Figure 10B:
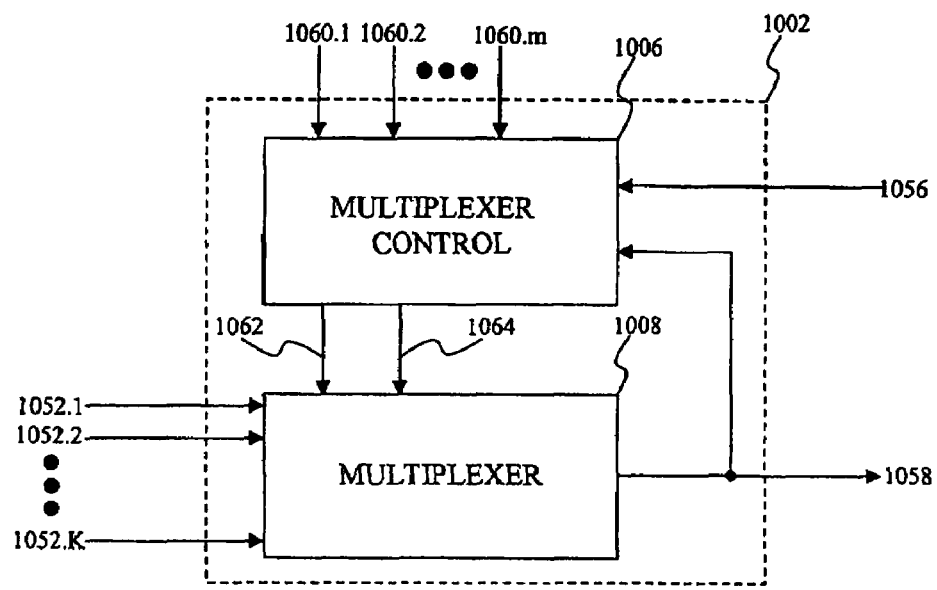
FIG. 10B illustrates a block diagram of a phase rotator according to an exemplary embodiment of the present invention.

FIG. 10B illustrates a block diagram of a phase rotator according to an exemplary embodiment of the present invention. The phase rotator 1002 selects among the VCO outputs 1052.1 through 1052.K in accordance with the backward and forward phase shifting operations. More specifically, the phase rotator 1002 includes a multiplexer control 1006 and a multiplexer 1008 to select among the VCO outputs 1052.1 through 1052.K based upon a control word 1060.1 through 1060.m.

The multiplexer control 1006 determines the sequence of the selection of the VCO outputs 1052.1 through 1052.K and the length of time the fractional frequency divider 1000 is to remain at a selected VCO output. The multiplexer control 1006 is synchronized to a clock that is derived from the clock 1058.

The multiplexer 1008 selects a VCO output from the VCO outputs 1052.1 through 1052.K based upon a control signal 1062 and a second control signal 1064 generated by the multiplexer control 1006. In exemplary embodiment, the second control signal 1064 is a complement of the first control signal 1062. The multiplexer 1008 generates the clock 1052 form the VCO output signals 1052.1 through 1052.K based on pair of control signals 1056 and 1058.

Figure 11:
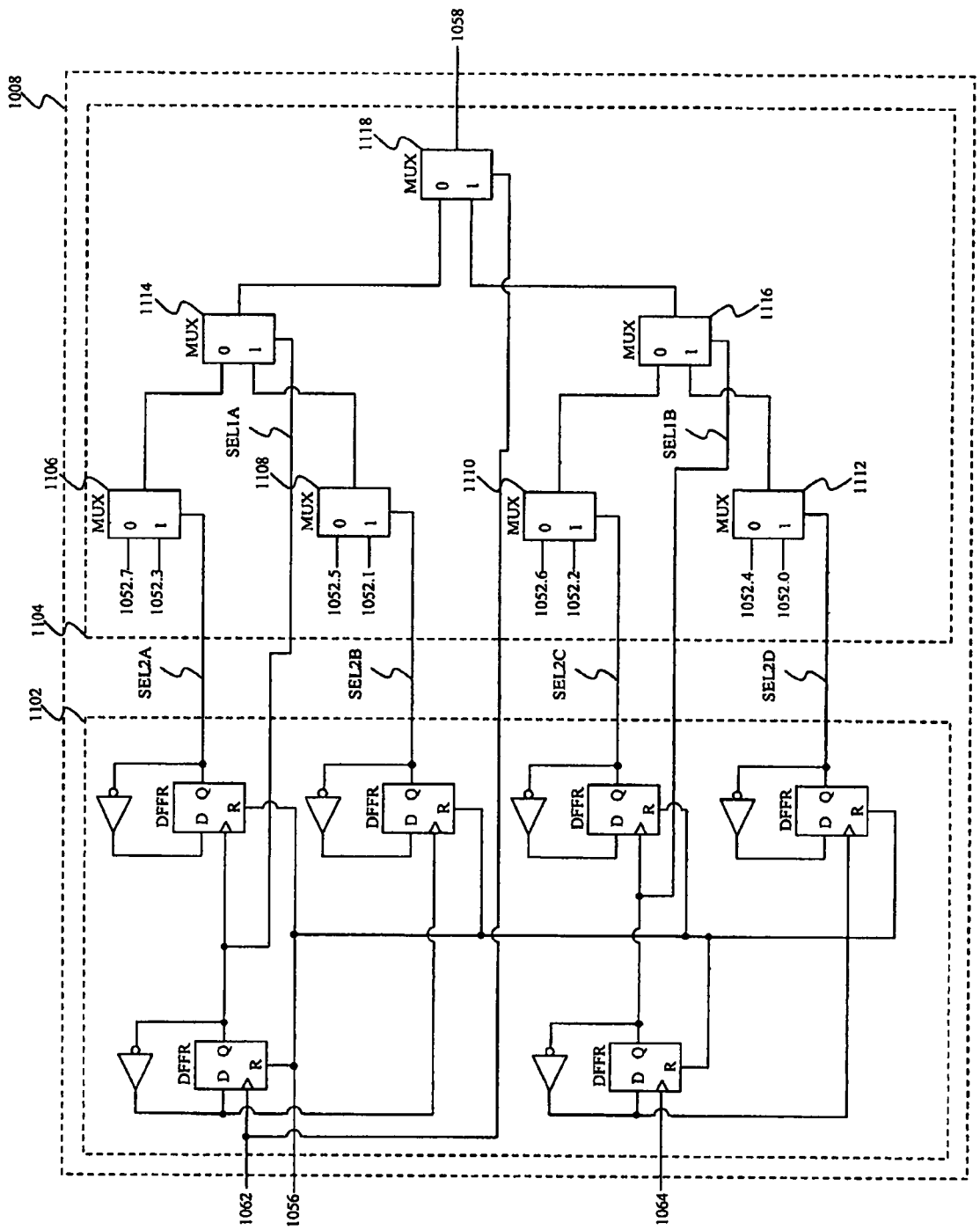
FIG. 11 illustrates a block diagram of a multiplexer circuit according to an exemplary embodiment of the present invention.

FIG. 11 illustrates a block diagram of a multiplexer circuit according to an exemplary embodiment of the present invention. The multiplexer circuit 1008 is included in a fractional frequency divider within a fractional-N phase-locked loop having a multi-phase voltage controlled oscillator (VCO) with eight VCO outputs denoted as voltage controlled oscillator outputs 1052.0 through 1052.7. Those skilled in the arts will recognize that the multiplexer circuit 1008 may be implemented according to the teachings herein using n VCO outputs 1052.0 through 1052.(n−1) without departing from the spirit and scope of the invention.

Referring to FIG. 11, the multiplexer circuit 1008 includes a selection circuit 1102 and a multiplexer 1104 to select among the VCO outputs 1052.0 through 1052.7 to generate the clock 1058 based upon the swap signals 1056 and 1058. The selection circuit 1102 generates control signals SEL1A, SEL2A, and SEL2B based upon the first control signal 1062 and control signals SEL1B, SEL2C, and SEL2D based upon the second control signal 1064. The selection circuit 1102 may be reset by selecting or toggling the reset 1056.

The multiplexer 1104 generates the clock 1058 by switching or selecting among the VCO 1052.0 through 1052.7 based upon the control signals SEL1A, SEL1B, and SEL2A through SEL2D. The multiplexer 1104 includes an 8:1 multiplexer having eight input signals to select from to generate a single output. In an exemplary embodiment, the multiplexer 1104 is implemented using seven 2:1 multiplexers. Those skilled in the arts will recognize that the multiplexer 1104 may be implemented using an 8:1 multiplexer, two 4:1 multiplexers, or any other suitable means, without departing from the spirit and scope of the invention. Referring back to FIG. 11, a multiplexer 1106 selects between VCO outputs 1052.7 and 1052.3 based upon the control signal SEL2A. Likewise, a multiplexer 1108 selects between VCO outputs 1052.5 and 1052.1 based upon the control signal SEL2B. Similarly, a multiplexer 1110 selects VCO outputs 1052.6 and 1052.2 based upon the control signal SEL2C. Further, a multiplexer 1112 selects between VCO outputs 1052.4 and 1052.0 based upon the control signal SEL2D. A multiplexer 1114 selects between an output of the multiplexer 1106 and an output of the multiplexer 1108 based upon the control signal SEL1A. Likewise, a multiplexer 1116 selects between an output of the multiplexer 1110 and an output of the multiplexer 1112 based upon the control signal SEL1B. Finally, a multiplexer 1118 selects between an output of the multiplexer 1114 and an output of the multiplexer 1116 based upon the first swap signal 1056 to generate the clock 1058. The following topology substantially ensures glitch less multiplexing of the VCO outputs 1052 and substantially ensures that only three out of seven multiplexer select signal are switching at every transition of the control signals 1062 and 1064. In other words, when control signals 1062 and 1064 are transitioning from a low to a high or a high to a low, in addition to the multiplexer 1118 select line toggling, only one of the multiplexer select signals SEL1A and SEL1B and only one of the multiplexer select signals SEL2A, SEL2B, SEL2C, and SEL2D are toggling.

In an exemplary embodiment, the voltage controlled oscillator outputs are arranged in such a manner as to provide glitch free transition when switching among the VCO outputs 1052.1 through 1052.K. In another exemplary embodiment, the VCO outputs are arranged in such a manner that a corresponding multiplexer selects between VCO outputs that are substantially offset in phase by $\pi$. For example, as shown in FIG. 11, the multiplexer 1112 selects between the VCO 1052.0 and the VCO output 1052.4 that are substantially offset in phase by $\pi$. Those skilled in the arts will recognize that other arrangements of the voltage controlled oscillator outputs are possible without departing from the spirit and scope of the invention.

Figure 12A:
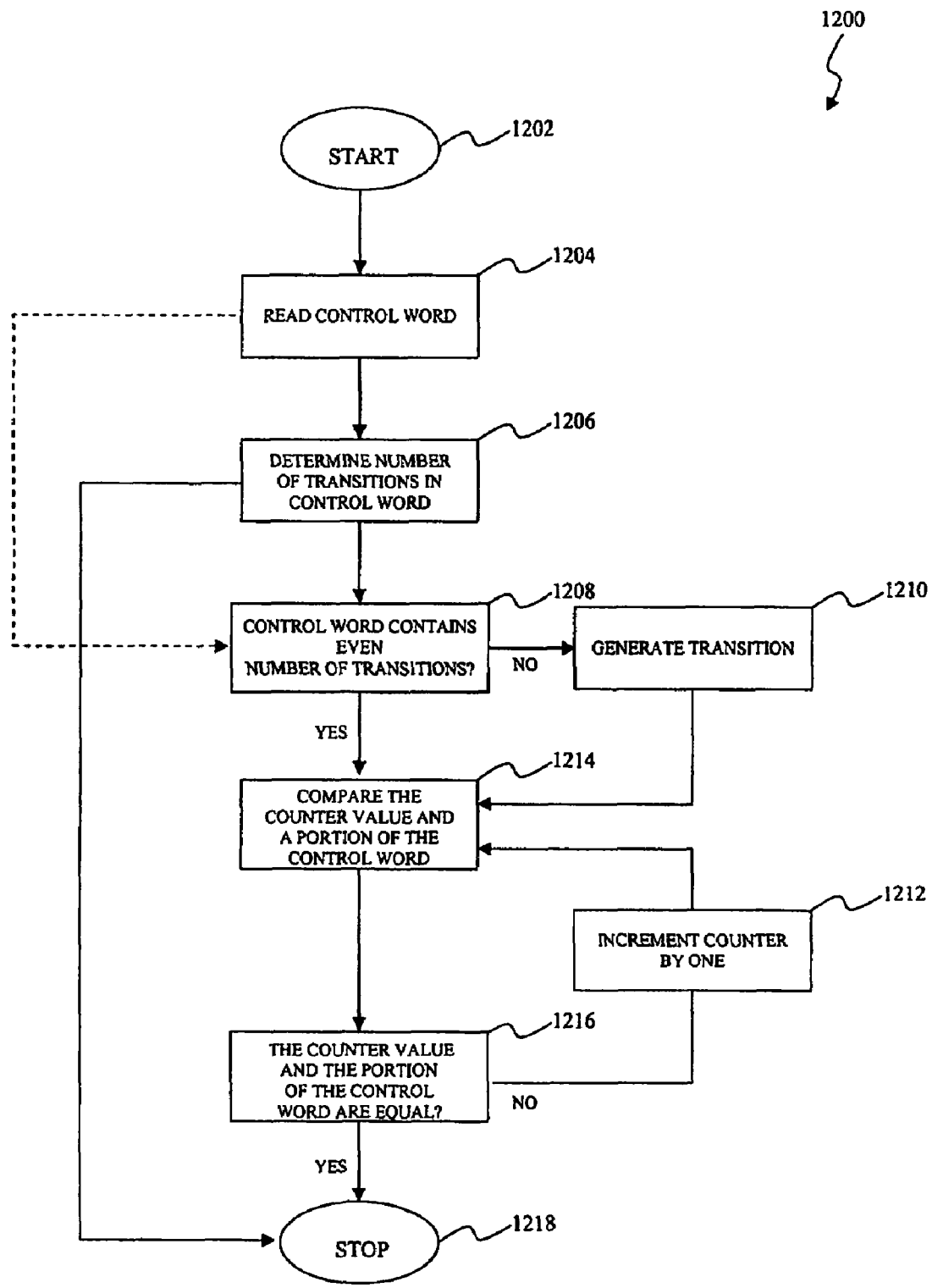
FIG. 12A is a flowchart of exemplary operational steps of a multiplexer control circuit according to an exemplary embodiment of the present invention.

FIG. 12A is a flowchart 1200 of exemplary operational steps of a multiplexer control circuit according to an exemplary embodiment of the present invention. The invention is not limited to this operational description. Rather, it will be apparent to persons skilled in the relevant art(s) from the teachings herein that other operational control flows are within the scope and spirit of the present invention. The following discussion describes the steps in FIG. 12A.

At step 1202, the multiplexer control circuit begins the operational steps to generate a sequence signal, such as the control signals 1062 and 1064. The sequencing signal dictates the order of selection among the voltage controlled oscillator (VCO) outputs, such as the VCO outputs 352.1 through 352.K or the VCO outputs 452.1 through 452.K, that are used to create a divided feedback signal, such as the divided feedback signal 354 or the divided feedback signal 454.

At step 1204, the multiplexer control circuit reads an m-bit control word. The m-bit control word, such as control word 1054 as shown in FIG. 10B, determines the number of transitions in the sequencing signal. The m-bit control word may be generated from an external source such as the dithering modulator 304.

At step 1206, the multiplexer control circuit determines the requisite number of transitions the fractional frequency divider requires to create the divided feedback signal from the m-bit control word. For example, when operating in the forward phase shifting mode, the multiplexer control circuit determines the number of times the fractional frequency divider switches from an input, such as the VCO output 352.1, having a greater phase offset to an input, such as the VCO output 352.2, having a lesser phase offset based upon the transitions of the sequencing signal to generate the divided feedback signal. Likewise, when operating in the backward phase shifting mode, the multiplexer control circuit determines the number of times the fractional frequency divider switches from an input, such as the VCO output 352.2, having a lesser phase offset to an input, such as the VCO output 352.1, having a greater phase offset based upon the transitions the sequencing signal to generate the divided feedback signal. If the fractional frequency divider requires no transitions, corresponding to an m-bit control word of zero, the multiplexer control operations proceeds to step 1218. In an exemplary embodiment, step 1206 is an optional step, the multiplexer control circuit may proceed from step 1204 to step 1208.

At step 1208, the multiplexer control circuit determines whether the number of transitions is an even number or an odd number by examining the m-bit control word. In an exemplary embodiment, the multiplexer control circuit examines the least significant bit (LSB) of the m-bit control word to determine whether the number of transitions is even or odd.

For example, a LSB of containing a binary zero represents an even number of transitions while a LSB containing a binary one represents an odd number of transitions. Those skilled in the art will recognize that the multiplexer control circuit may use any suitable means to determine whether the number of transitions is an even number or an odd number without departing from the spirit and scope of the invention. If the number of transitions is odd, the multiplexer control circuit proceeds to step 1210. Otherwise, the multiplexer control circuit proceeds to step 1214 for an even number of transitions.

At step 1210, the multiplexer control circuit inserts a transition in the beginning of the sequencing signal when the number of transitions determined in step 1208 corresponds to an odd number of transitions and proceeds to step 1214. In an exemplary embodiment, the multiplexer control circuit inverts a clock within the multiplexer control circuit to insert the transition at the beginning of the sequencing signal. Those skilled in the art will recognize that the multiplexer control circuit may insert the additional transition in any position in the sequencing signal without departing from the spirit and scope of the invention.

At step 1214, the multiplexer control circuit compares the value of the counter and the m-bit control word to determine whether the sequencing signal has the requisite number of transitions to create the divided feedback signal. In an exemplary embodiment, the multiplexer control circuit compares the value of the counter with a portion of the m-bit control word represented by the binary value of the (m−1) most significant bits (MSBs) of the m-bit control word. For example, a three bit control word includes the bits $m_2$, $m_1$, and $m_0$. In this exemplary embodiment, the multiplexer control circuit compares the value of the counter with the binary value represented by $m_2$ and $m_1$. For example, the multiplexer control circuit compares the value of the counter with the binary representation of 10 or two for a three bit control word of 101.

At step 1216, the multiplexer control circuit determines whether the value of the counter and the m-bit control word are equivalent. In an exemplary embodiment, the multiplexer control circuit determines whether the value of the counter and the portion of the m-bit control word represented by the binary value of the (m−1) most significant bits (MSBs) of the m-bit control word are equal. As an example, for a three bit control word represented by bits $m_2$, $m_1$, and $m_0$, the multiplexer control circuit determines whether a value of a counter mechanism and the binary value represented by $m_2$ and $m_1$ are equivalent. If the multiplexer control circuit determines the value of the counter mechanism and the m-bit control word are not equivalent the circuit proceed to step 1212.

At step 1212, the multiplexer control circuit increments the counter mechanism, such as a binary counter or any other suitable means, by one. Each instance the counter mechanism is incremented increases the number of transitions by one. For example, a counter value of two represents a sequencing signal having two transitions when the number of transitions determined in step 1208 is an even number, otherwise the counter value of two represents a sequencing signal having three transitions when the number of transitions determined in step 1208 is an odd number. After incrementing the counter by one the control circuit reverts back to step 1214. The process is repeated until the counter value and m-bit control value are equivalent.

If the multiplexer control circuit determines the value of the counter and the m-bit control word are equivalent, the multiplexer control circuit proceeds to step 1218. At step 1218, the multiplexer control circuit has generated the sequencing signal with the proper amount of transitions to allow the fractional frequency divider to create the divided feedback signal.

Figure 12B:
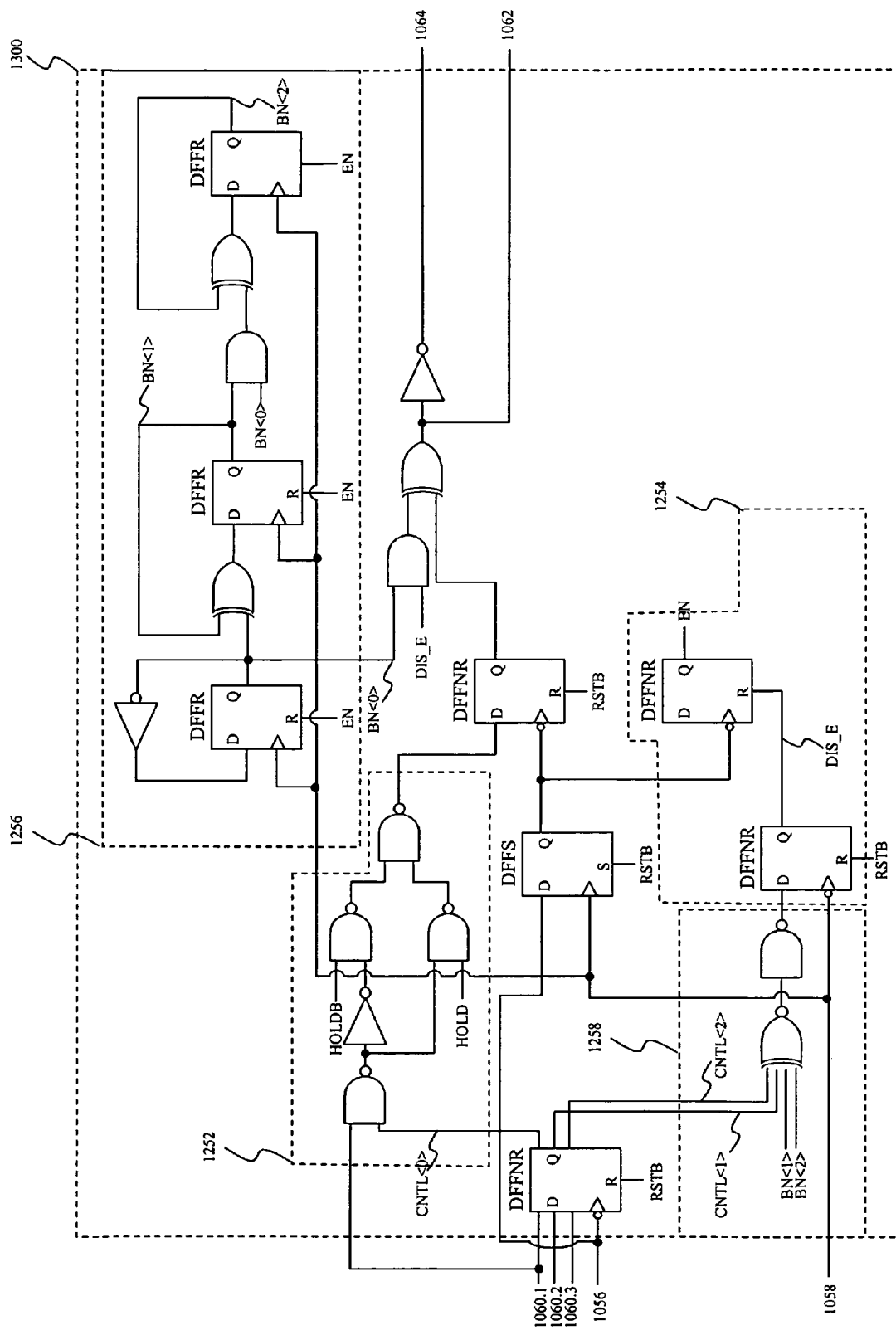
FIG. 12B is a block diagram of a multiplexer control circuit according to an exemplary embodiment of the present invention.

FIG. 12B is a block diagram of a multiplexer control circuit according to an exemplary embodiment of the present invention. The multiplexer control circuit 1006 is included in a fractional frequency divider within a fractional-N phase-locked loop having a multi-phase voltage controlled oscillator (VCO) with eight VCO outputs. The eight VCO outputs require a three bit control word, denoted as control words 1060.1 through 1060.3, to switch among the eight VCO outputs to generate the divided feedback signal 1054 as shown in FIG. 10A.

As shown in FIG. 12B, the multiplexer control circuit 1006 includes a determination module 1252, a counter enable module 1254, a counter module 1256, and a comparison module 1258. The determination module 1252 determines whether a binary representation of the control words 1060.1 through 1060.3 is an even number or an odd number by examining the control word 1060.1. If the binary of representation of the control word 1060.1 is a binary one, representing an odd number, hold values, denoted as HOLD and HOLDB, change state causing an additional transition in the control signals 1062 and 1064. Otherwise, if the binary of representation of the control word 1060.1 is a binary zero, representing an even number, hold values, denoted as HOLD and HOLDB, remain at the current state.

The counter enable module 1254 generates signal EN that enables the counter module 1256 based upon the output of the comparison module 1258 and the reset signal 1056 from the integer divider 1004 as shown in FIG. 10A. In an exemplary embodiment, when EN is a logical 1 the counter increments at every clock 1058. When EN is a logical 0 the counter module 1256 is reset to a '000' state. EN is set to the logical 1 at a high to a low transition of the reset 1056 and is reset to the logical 0 when control words 1060.1 through 1060.3 and the value of the counter module 1256 are substantially equivalent. The counter module 1256 uses a binary counter to generate a three bit output denoted as BN<0> through BN<2>, where BN<0> is a representation of the LSB of the counter module 1256 and BN<2> is a representation of the MSB of the counter module 1256. In the exemplary embodiment of FIG. 12B, the counter module 1256 is implemented using a configuration of flip flops having reset functions. The comparison module 1258 compares the two MSBs of the three bit output, namely BN<2> and BN<1>, to the two MSBs of the control words 1060, namely control words 1060.2 and 1060.3.

The multiplexer control circuit 1006 also includes a global reset function connected to reset 1056 to allow the fractional frequency divider 1000 to begin generating next fractional value.

Figure 13A:
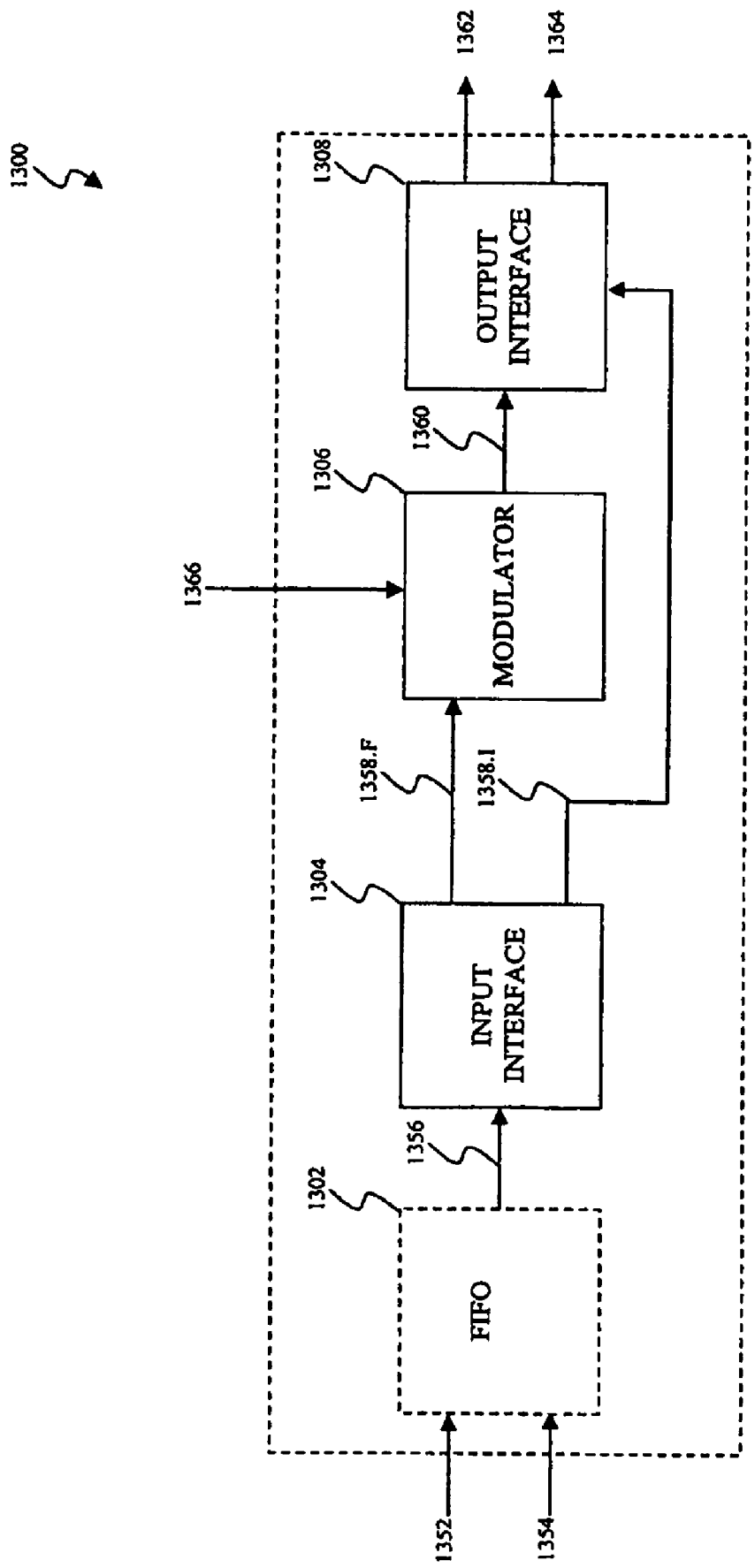
FIG. 13A is a block diagram of a sigma delta modulator according to an exemplary embodiment of the present invention.

FIG. 13A is a block diagram of a sigma delta modulator according to an exemplary embodiment of the present invention. A sigma delta modulator 1300 is an exemplary representation of the dithering modulator 404 as shown in FIG. 4. Those skilled in the arts will recognize that the dithering modulator 404 is not limited to this exemplary embodiment; other embodiments may be used to perform the dithering operation without departing from the spirit and scope of the invention.

As shown in FIG. 13A, the sigma delta modulator 1300 includes a First In, First Out (FIFO) queue 1302, an input interface 1304, a modulator 1306, and an output interface 1308. The FIFO 1302 loads an input frequency control word 1352 depending upon a clock 1354 to produce a queued frequency control word 1356. The input frequency control word 1352 is an exemplary representation of the control signal 450 as shown in FIG. 4. The input frequency control word 1352 may include an integer word and a fraction word. In an exemplary embodiment, the input frequency control word 1352 is thirty-three bits in length with nine bits allocated to the integer word and twenty-four bits allocated to the fraction word. In another exemplary embodiment, the FIFO 1302 is optional for applications where the input frequency control word 1352 is static. For this exemplary embodiment, the input frequency control word 1352 is used as an input for the input interface 1304.

The input interface 1304 produces an encoded frequency control word 1358 based upon the modulator 1306. More specifically, the input interface 1304 takes the queued frequency control word 1356 from the FIFO 1302, and encodes the queued frequency control word 1356 appropriately for the modulator 1306. The encoded frequency control word 1358 includes an integer word, denoted as 1358.I in FIG. 13A, and a fraction word, denoted as 1358.F in FIG. 13A. The integer word 1358.I is sent to the output interface 1308 while the fractional word 1358.F is sent to the modulator 1306. The encoding of the queued frequency control word 1356 is a function of an input dynamic range for the modulator 1306.

The modulator 1306 outputs a random sequence 1360 based upon a divided feedback signal 1366 and the fractional word 1358.F. The divided feedback signal 1366 is an exemplary representation of the divided feedback signal 454 as shown in FIG. 4. The random sequence 1360 has an average equal to the fractional word 1358.F as produced by the input interface 1304. The modulator 1306 may include, but is not limited to, a multi-feedback (MFB) modulator, a MASH 1-1-1 modulator, or any other suitable modulator to provide some examples. In an exemplary embodiment, the fractional word 1358.F is twenty-four bits and the random sequence 1360 is four bits.

The output interface 1308 sums the integer word 1358.I from the input interface 1304 and the random sequence 1306 from the modulator 1306 to output an integer control word 1362 and a fractional control word 1364. The fractional control word 1364 may be used to control the phase rotator 1002 as shown in FIG. 10A, while the integer control word 1362 may be used to control the integer divider 1004 as shown in FIG. 10A.

Figure 13B:
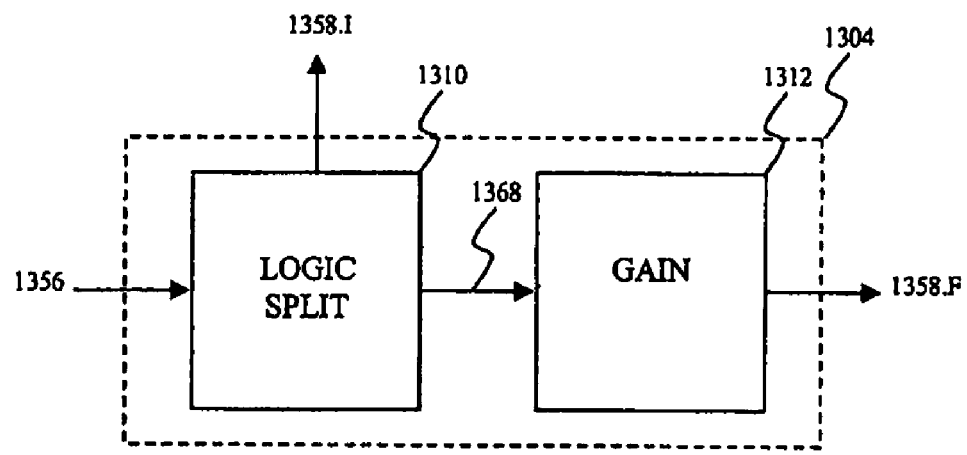
FIG. 13B is a block diagram of an input interface according to an exemplary embodiment of the present invention.

FIG. 13B is a block diagram of an input interface according to an exemplary embodiment of the present invention. The input interface 1304 includes a logic split 1310 and a gain stage 1312. As shown in FIG. 13B, the logic split separates or splits the queued frequency control word 1356 into the integer word 1358.I and a fractional portion 1368. The gain stage 1312 produces the fractional word 1358.F based upon the fractional portion 1368. More specifically, the gain stage 1312 encodes the fractional portion 1368 based upon the input dynamic range for the modulator 1306. The gain stage 1312 generates the fractional word 1358.F by multiplying the fractional portion 1368 by the number of VCO outputs, where the number of voltage controlled oscillator (VCO) outputs represents the number of outputs of a multi-phased VCO such as VCO outputs 352.1 through 352.K or VCO outputs 452.1 through 452 to provide some examples. Multiplying the fractional portion 1368 by the number of VCO outputs may be implemented by shifting the fractional portion 1368 to the left by $Log_2$(number of VCO outputs) bits or any other suitable means.

Figure 13C:
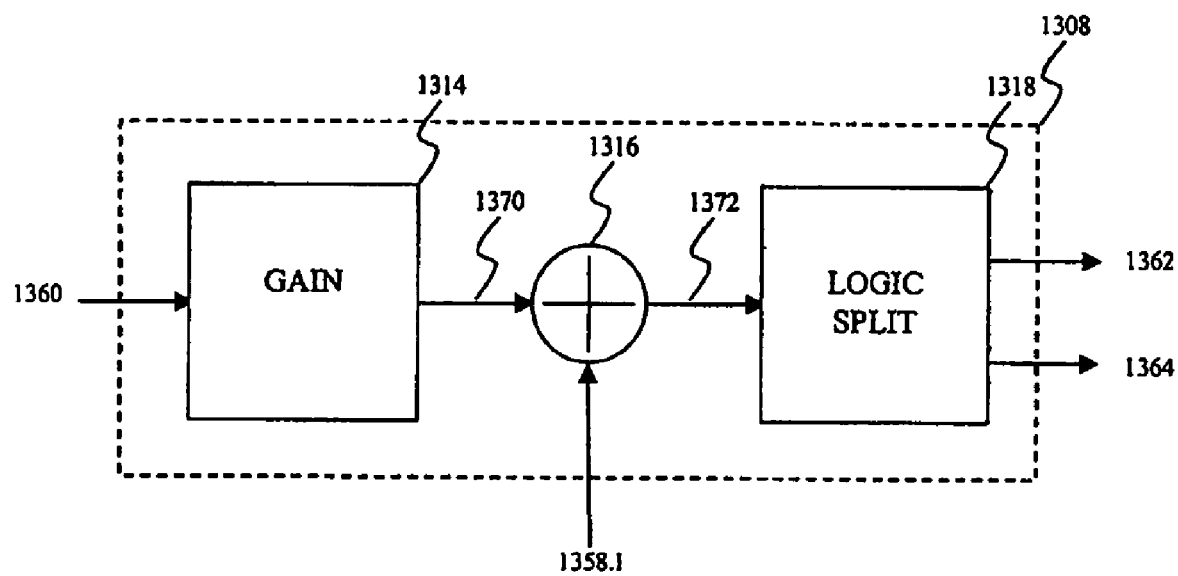
FIG. 13C is a block diagram of an output interface according to an exemplary embodiment of the present invention.

FIG. 13C is a block diagram of an output interface according to an exemplary embodiment of the present invention. The output interface 1308 includes a gain stage 1314, a summing module 1316, and a logic split 1318. The gain stage 1314 generates a fractional portion 1370 by dividing the random sequence 1360 by the number of VCO outputs, where the number of voltage controlled oscillator (VCO) outputs represents the number of outputs of a multi-phased VCO such as VCO outputs 352.1 through 352.K or VCO outputs 452.1 through 452 to provide some examples. Dividing the random sequence 1360 by the number of VCO outputs may be implemented by shifting the random sequence 1360 to the right by $Log_2$(number of VCO outputs) bits or any other suitable means. The summing module combines the integer word 1358.1 with the fractional portion 1370 to produce a combined control word 1372. The logic split 1318 then splits the combined control word 1372 into the integer control word 1362 and the fractional control word 1364.

CONCLUSION

While various embodiments of the present invention have been described above, it should be understood that they have been presented by way of example and not limitation. It will be apparent to one skilled in the pertinent art that various changes in form and detail can be made therein without departing from the spirit and scope of the invention. Therefore, the present invention should only be defined in accordance with the following claims and their equivalents.

What is claimed is:

1. A phase-locked loop (PLL), configured to receive a reference signal, comprising:
 a phase detector configured to output an error signal based on a difference between a divided feedback signal and the reference signal;
 a voltage controlled oscillator configured to output a plurality of voltage controlled oscillator outputs based on the error signal; and
 a fractional frequency divider configured to arrange the plurality of voltage controlled oscillator outputs in one or more pairs of voltage controlled oscillator outputs, each voltage controlled oscillator output from the one or more pairs being substantially offset in phase by $\pi$, wherein the fractional frequency divider is configured to generate the divided feedback signal by switching from a first voltage controlled oscillator output from the plurality of voltage controlled oscillator outputs to a second voltage controlled oscillator output from the plurality of voltage controlled oscillator outputs, and
 wherein a phase offset of the first voltage controlled oscillator output is greater than a phase offset of the second voltage controlled oscillator output.

2. The PLL of claim 1, further comprising:
 a dithering modulator coupled to the fractional frequency divider, wherein the dithering modulator is configured to dither a divide value of the fractional frequency divider between a first fractional value and a second fractional value.

3. The PLL of claim 2, wherein the dithering modulator is a sigma-delta modulator.

4. The PLL of claim 1, wherein the fractional frequency divider is configured to incrementally switch from the first voltage controlled oscillator output to the second voltage controlled oscillator output.

5. The PLL of claim 1, wherein the fractional frequency divider is configured to switch among the plurality of voltage controlled oscillator outputs in a counter-clockwise manner.

6. The PLL of claim 1, wherein the fractional frequency divider is configured to switch from the first voltage controlled oscillator output to the second voltage controlled oscillator output based on a falling edge of the first voltage controlled oscillator output.

7. The PLL of claim 1, wherein the fractional frequency divider comprises:
   a phase rotator configured to generate a clock signal by switching from the first voltage controlled oscillator output to the second voltage controlled oscillator output; and
   an integer divider configured to generate the divided feedback signal based upon the clock signal.

8. The PLL of claim 7, wherein the phase rotator comprises:
   a multiplexer control circuit configured to generate a control signal based upon a control word, wherein the control word is configured to determine a number of transitions required to generate the divided feedback signal; and
   a multiplexer configured to generate the clock signal by switching from the first voltage controlled oscillator output to the second voltage controlled oscillator output based upon the control signal.

9. A phase-locked loop (PLL), configured to receive a reference signal, comprising:
   a phase detector configured to output an error signal based on a difference between a divided feedback signal and the reference signal;
   a voltage controlled oscillator configured to output a plurality of voltage controlled oscillator outputs based on the error signal; and
   a fractional frequency divider configured to arrange the plurality of voltage controlled oscillator outputs in one or more pairs of voltage controlled oscillator outputs, each voltage controlled oscillator output from the one or more pairs being substantially offset in phase by $\pi$, wherein the fractional frequency divider is configured to generate the divided feedback signal by switching from a first voltage controlled oscillator output from the plurality of voltage controlled oscillator outputs to a second voltage controlled oscillator output from the plurality of voltage controlled oscillator outputs, and
   wherein a phase offset of the first voltage controlled oscillator output is lesser than a phase offset of the second voltage controlled oscillator output.

10. The PLL of claim 9, further comprising:
   a dithering modulator coupled to the fractional frequency divider, wherein the dithering modulator is configured to dither a divide value of the fractional frequency divider between a first fractional value and a second fractional value.

11. The PLL of claim 10, wherein the dithering modulator is a sigma-delta modulator.

12. The PLL of claim 9, wherein the fractional frequency divider is configured to incrementally switch from the first voltage controlled oscillator output to the second voltage controlled oscillator output.

13. The PLL of claim 9, wherein the fractional frequency divider is configured to switch among the plurality of voltage controlled oscillator outputs in a clockwise manner.

14. The PLL of claim 9, wherein the fractional frequency divider is configured to switch from the first voltage controlled oscillator output to the second voltage controlled oscillator output based on a rising edge of the first voltage controlled oscillator output.

15. The PLL of claim 9, wherein the fractional frequency divider comprises:
   a phase rotator configured to generate a clock signal by switching from the first voltage controlled oscillator output to the second voltage controlled oscillator output; and
   an integer divider configured to generate the divided feedback signal based upon the clock signal.

16. The PLL of claim 15, wherein the phase rotator comprises:
   a multiplexer control circuit configured to generate a control signal based upon a control word, wherein the control word is configured to determine a number of transitions required to generate the divided feedback signal; and
   a multiplexer configured to generate the clock signal by switching from the first voltage controlled oscillator output to the second voltage controlled oscillator output based upon the control signal.

17. A phase-locked loop (PLL), configured to receive a reference signal, comprising:
   a phase detector configured to output an error signal based on a difference between a divided feedback signal and the reference signal;
   a voltage controlled oscillator configured to output a plurality of voltage controlled oscillator outputs based on the error signal; and
   a fractional frequency divider configured to arrange the plurality of voltage controlled oscillator outputs in one or more pairs of voltage controlled oscillator outputs, each voltage controlled oscillator output from the one or more pairs being substantially offset in phase by $\pi$, wherein the fractional frequency divider is configured to generate at least one of a first fractional value and a second fractional value by switching among the plurality of voltage controlled oscillator outputs, and to dither a divide value of the fractional frequency divider between the first fractional value and the second fractional value to produce the divided feedback signal.

18. The PLL of claim 17, further comprising:
   a dithering modulator coupled to the fractional frequency divider, wherein the dithering modulator is configured to produce a divide control signal, wherein the fractional frequency divider is configured to dither the divide value based upon the divide control signal.

19. The PLL of claim 18, wherein the dithering modulator is configured to produce the divide control signal based upon a fractional control signal.

20. The PLL of claim 17, wherein at least one of the first fractional value and the second fractional value is generated by switching from a first voltage controlled oscillator output from the plurality of voltage controlled oscillator outputs to a second voltage controlled oscillator output from the plurality of voltage controlled oscillator outputs.

21. The PLL of claim 20, wherein a phase offset of the first voltage controlled oscillator output is greater than a phase offset of the second voltage controlled oscillator output.

22. The PLL of claim 20, wherein a phase offset of the first voltage controlled oscillator output is lesser than a phase offset of the second voltage controlled oscillator output.

23. The PLL of claim 17, wherein the plurality of voltage controlled oscillator outputs includes a plurality of phase offsets.

24. The PLL of claim 23, wherein each one of the voltage controlled oscillator outputs in the plurality of voltage controlled oscillator outputs has a corresponding phase offset in the plurality of phase offsets.

25. The PLL of claim 24, wherein a sum of all the corresponding phases of the voltage controlled oscillator outputs in the plurality of voltage controlled oscillator outputs substantially equals $2\pi$.

26. The PLL of claim 25, wherein at least one of the first fractional value and the second fractional value is generated by switching from a first voltage controlled oscillator output from the plurality of voltage controlled oscillator outputs to a second voltage controlled oscillator output from the plurality of voltage controlled oscillator outputs.

27. The PLL of claim 25, wherein at least one of the first fractional value and the second fractional value is generated by switching from a first voltage controlled oscillator output from the plurality of voltage controlled oscillator outputs having a greatest phase offset to a second voltage controlled oscillator output from the plurality of voltage controlled oscillator outputs having a least phase offset.

28. The PLL of claim 25, wherein at least one of the first fractional value and the second fractional value is generated by switching from a first voltage controlled oscillator output from the plurality of voltage controlled oscillator outputs having a least phase offset to a second voltage controlled oscillator output from the plurality of voltage controlled oscillator outputs having a greatest phase offset.

29. The PLL of claim 17, wherein fractional frequency divider comprises:
 a phase rotator configured to generate a clock signal by switching from the first voltage controlled oscillator output to the second voltage controlled oscillator output; and
 an integer divider configured to generate the divided feedback signal based upon the clock signal.

30. The PLL of claim 29, wherein the phase rotator comprises:
 a multiplexer control circuit configured to generate a control signal based upon a control word, wherein the control word is configured to determine a number of transitions required to generate the divided feedback signal; and
 a multiplexer configured to generate the clock signal by switching from the first voltage controlled oscillator output to the second voltage controlled oscillator output based upon the control signal.

31. A phase-locked loop (PLL), configured to receive a reference signal, comprising:
 a phase detector configured to output an error signal based on a difference between a divided feedback signal and the reference signal;
 a voltage controlled oscillator configured to output a plurality of voltage controlled oscillator outputs based on the error signal;
 means for arranging the plurality of voltage controlled oscillator outputs in one or more pairs of voltage controlled oscillator outputs, each voltage controlled oscillator output from the one or more pairs being substantially offset in phase by $\pi$; and
 means for generating the divided feedback signal by switching from a first voltage controlled oscillator output from the plurality of voltage controlled oscillator outputs to a second voltage controlled oscillator output from the plurality of voltage controlled oscillator outputs,
 wherein a phase offset of the first voltage controlled oscillator output is greater than a phase offset of the second voltage controlled oscillator output.

32. The PLL of claim 31, wherein the for generating the divided feedback signal is configured to incrementally switch from the first voltage controlled oscillator output to the second voltage controlled oscillator output.

33. The PLL of claim 31, wherein the means for generating the divided feedback signal is configured to switch among the plurality of voltage controlled oscillator outputs in a counter-clockwise manner.

34. The PLL of claim 31, wherein means for generating the divided feedback signal is configured to switch from the first voltage controlled oscillator output to the second voltage controlled oscillator output based on a falling edge of the first voltage controlled oscillator output.

35. A phase-locked loop (PLL), configured to receive a reference signal, comprising:
 a phase detector configured to output an error signal based on a difference between a divided feedback signal and the reference signal;
 a voltage controlled oscillator configured to output a plurality of voltage controlled oscillator outputs based on the error signal;
 means for arranging the plurality of voltage controlled oscillator outputs in one or more pairs of voltage controlled oscillator outputs, each voltage controlled oscillator output from the one or more pairs being substantially offset in phase by $\pi$; and
 means for generating the divided feedback signal by switching from a first voltage controlled oscillator output from the plurality of voltage controlled oscillator outputs to a second voltage controlled oscillator output from the plurality of voltage controlled oscillator outputs,
 wherein a phase offset of the first voltage controlled oscillator output is lesser than a phase offset of the second voltage controlled oscillator output.

36. The PLL of claim 35, wherein the means for generating the divided feedback signal is configured to incrementally switch from the first voltage controlled oscillator output to the second voltage controlled oscillator output.

37. The PLL of claim 35, wherein the for generating the divided feedback signal is configured to switch among the plurality of voltage controlled oscillator outputs in a clockwise manner.

38. The PLL of claim 35, wherein the for generating the divided feedback signal is configured to switch from the first voltage controlled oscillator output to the second voltage controlled oscillator output based on a rising edge of the first voltage controlled oscillator output.

39. A method to phase lock a corresponding output of a voltage controlled oscillator having a plurality of voltage controlled oscillator outputs to a reference signal, the method comprises the steps of:
 comparing a divided feedback signal to the reference signal to produce an error signal;
 adjusting a frequency of a voltage controlled oscillator based upon the error signal until the frequency of the voltage controlled oscillator is matched to the reference signal;
 arranging the plurality of voltage controlled oscillator outputs in one or more pairs of voltage controlled oscillator outputs, each voltage controlled oscillator output from the one or more pairs being substantially offset in phase by $\pi$, and
 generating the divided feedback signal by switching among the plurality of voltage controlled oscillator outputs.

40. The method of claim 39, wherein the step of comparing the divided feedback signal to the reference signal further comprises:
 comparing a phase of the divided feedback signal to a phase of the reference signal.

41. The method of claim 39, adjusting a frequency of a voltage controlled oscillator further comprises:

adjusting the frequency of the voltage controlled oscillator until the frequency of the voltage controlled oscillator is matched to the reference signal in frequency and phase.

42. The method of claim 39, wherein the step of generating the divided feedback signal comprises:

incrementally switching from a first voltage controlled oscillator output from the plurality of voltage controlled oscillator outputs to a second voltage controlled oscillator output from the plurality of voltage controlled oscillator outputs.

43. The method of claim 39, wherein the step of generating the divided feedback signal comprises:

incrementally switching from a first voltage controlled oscillator output from the plurality of voltage controlled oscillator outputs to a second voltage controlled oscillator output from the plurality of voltage controlled oscillator outputs in a counter-clockwise manner.

44. The method of claim 39, wherein the step of generating the divided feedback signal comprises:

incrementally switching from a first voltage controlled oscillator output from the plurality of voltage controlled oscillator outputs to a second voltage controlled oscillator output from the plurality of voltage controlled oscillator outputs in a clockwise manner.

45. The method of claim 39, wherein the step of generating the divided feedback signal comprises:

switching from a first voltage controlled oscillator output from the plurality of voltage controlled oscillator outputs to a second voltage controlled oscillator output from the plurality of voltage controlled oscillator outputs based on a falling edge of the first voltage controlled oscillator output.

46. The method of claim 39, wherein the step of generating the divided feedback signal comprises:

switching from a first voltage controlled oscillator output from the plurality of voltage controlled oscillator outputs to a second voltage controlled oscillator output from the plurality of voltage controlled oscillator outputs based on a rising edge of the first voltage controlled oscillator output.

47. A phase-locked loop (PLL), configured to receive a reference signal, comprising:

a phase detector configured to output an error signal based on a difference between a divided feedback signal and the reference signal;

a voltage controlled oscillator configured to output a plurality of voltage controlled oscillator outputs based on the error signal; and a fractional frequency divider configured to select among one or more pairs of voltage controlled oscillator outputs from the plurality of voltage controlled oscillator outputs to generate the divided feedback signal, each pair of voltage controlled oscillator outputs including a first voltage controlled oscillator output and a second voltage controlled oscillator output.

48. The PLL of claim 47, wherein the first voltage controlled oscillator output is substantially offset in phase by $\pi$ from the second voltage controlled oscillator output.

* * * * *

UNITED STATES PATENT AND TRADEMARK OFFICE
CERTIFICATE OF CORRECTION

PATENT NO. : 7,605,665 B2
APPLICATION NO. : 11/802879
DATED : October 20, 2009
INVENTOR(S) : Chambers et al.

Page 1 of 1

It is certified that error appears in the above-identified patent and that said Letters Patent is hereby corrected as shown below:

In the title page, item (75) Inventors, "Huntingdon Beach" should be replaced by --Huntington Beach--.

At column 12, line 12, "skilled in art the" should be replaced by --skilled in the art--.

At column 13, line 4, "skilled in art the" should be replaced by --skilled in the art--.

At column 14, line 26, "skilled in art the" should be replaced by --skilled in the art--.

At column 15, line 56, "skilled in art the" should be replaced by --skilled in the art--.

At column 17, line 32, "skilled in art the" should be replaced by --skilled in the art--.

At column 18, line 57, "skilled in art the" should be replaced by --skilled in the art--.

At column 20, line 20, "skilled in art the" should be replaced by --skilled in the art--.

At column 35, line 60, "wherein the for generating" should be replaced by --wherein the means for generating--.

At column 36, line 33, "wherein the for generating" should be replaced by --wherein the means for generating--.

At column 36, line 37, "wherein the for generating" should be replaced by --wherein the means for generating--.

Signed and Sealed this

Ninth Day of November, 2010

David J. Kappos
*Director of the United States Patent and Trademark Office*